(12) United States Patent
Fleischmann et al.

(10) Patent No.: US 10,778,171 B2
(45) Date of Patent: Sep. 15, 2020

(54) EQUALIZATION FILTER COEFFICIENT DETERMINATOR, APPARATUS, EQUALIZATION FILTER COEFFICIENT PROCESSOR, SYSTEM AND METHODS

(71) Applicant: Fraunhofer-Gesellschaft zur Foerderung der angewandten Forschung e.V., Munich (DE)

(72) Inventors: Felix Fleischmann, Stein (DE); Jan Plogsties, Fuerth (DE); Bernhard Neugebauer, Erlangen (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 220 days.

(21) Appl. No.: 14/830,821

(22) Filed: Aug. 20, 2015

(65) Prior Publication Data

US 2016/0036404 A1 Feb. 4, 2016

Related U.S. Application Data

(63) Continuation of application No. PCT/EP2014/053480, filed on Feb. 21, 2014.
(Continued)

(30) Foreign Application Priority Data

Mar. 15, 2013 (EP) .................................... 13159563

(51) Int. Cl.
*H03G 5/16* (2006.01)
*H03G 5/00* (2006.01)

(52) U.S. Cl.
CPC ............. *H03G 5/165* (2013.01); *H03G 5/005* (2013.01)

(58) Field of Classification Search
CPC .............................. H03G 5/165; H03G 5/005
(Continued)

(56) References Cited

U.S. PATENT DOCUMENTS 6,570,943 B2 5/2003 Goldston et al.
6,985,749 B2 1/2006 Bannasch et al.
(Continued)

FOREIGN PATENT DOCUMENTS

GB  2 265 528 A   9/1993
JP  2011-197429 A  10/2011
(Continued)

OTHER PUBLICATIONS

Moller, H. et al., "Design Criteria for Headphones", J. Audio Engineering Society, vol. 43, No. 4, Apr. 1995, pp. 218-232.
(Continued)

*Primary Examiner* — Vivian C Chin
*Assistant Examiner* — Douglas J Suthers
(74) *Attorney, Agent, or Firm* — Keating & Bennett, LLP

(57) ABSTRACT

An equalization filter coefficient determinator continuously or quasi-continuously fades between a plurality of different equalizer settings in dependence on one or more setting parameters, to obtain a current set of equalization filter target coefficients describing a current equalizer setting. A number of setting parameters is smaller than a number of equalization filter target coefficients of current set of equalization filter target coefficients. An equalization filter coefficient determinator linearly combines a plurality of equalization filter target coefficient set components in dependence on one or more setting parameters. An equalization filter coefficient determinator obtains the current set of equalization filter target coefficients in dependence on position information obtained using a two-dimensional or three-dimensional user input device. An apparatus includes a user interface, an
(Continued)

equalization filter coefficient determinator and an equalizer. An equalization filter coefficient processor may provide sets of basis equalization filter target coefficients. A system is also described.

31 Claims, 10 Drawing Sheets

Related U.S. Application Data

(60) Provisional application No. 61/768,724, filed on Feb. 25, 2013.

(58) Field of Classification Search
USPC .................. 381/103, 98; 700/94; 708/323
See application file for complete search history.

(56) References Cited

U.S. PATENT DOCUMENTS

| | | |
|---|---|---|
| 8,121,302 B2 | 2/2012 | Skuruls |
| 8,160,280 B2 | 4/2012 | Strauss et al. |
| 2011/0142247 A1 | 6/2011 | Fellers et al. |

FOREIGN PATENT DOCUMENTS

| | | |
|---|---|---|
| JP | 2011-530218 A | 12/2011 |
| JP | 2012-195899 A | 10/2012 |
| RU | 2 222 871 C2 | 1/2004 |
| RU | 2 282 944 C2 | 8/2006 |
| RU | 2 419 963 C2 | 5/2011 |
| WO | 2010/138309 A1 | 12/2010 |

OTHER PUBLICATIONS

Lorho, G., "Subjective Evaluation of Headphone Target Frequency Responses", Audio Engineering Society, Convention Paper 7770, 126th Convention, May 7-10, 2009, 20 pages.

Fleischmann, F. et al., "Headphone Equalization-Measurement, Design and Psychoacoustic Evaluation", Springer, Oct. 7, 2011, pp. 301-311.

Jolliffe, I. T., "Principal Component Analysis", Second Edition, Springer Series in Statistics, vol. XXIX, No. 48, 2002, 518 pages.

Hwang, S. et al., "HRIR Customization in the Median Plane via Principal Components Analysis", AES 31st International Conference, Jun. 25-27, 2007, pp. 1-9.

Electroacoustics—Simulators of Human Head and Ear—Part 1: Ear Simulator for the Measurement of Supra-aural and Circumaural Earphones, International Standard, International Electrotechnical Commission 60318-1, Edition 2.0, Aug. 2009, 54 pages.

Acoustics—Determination of Sound Immission from Sound Sources Placed Close the the Ear—Part 1: Technique Using a Microphone in a Real Ear (MIRE Technique), ISO 11904-1:2002, Feb. 2003, 34 pages.

Official Communication issued in corresponding International Application PCT/EP2014/053480, dated May 22, 2014.

Official Communication issued in corresponding Japanese Patent Application 2015-558472, dated Sep. 13, 2016.

(FREQUENCY RESPONSE OF DIFFERENT HEADPHONES)
PRIOR ART a) frequency response headphone b) filter for a) to achieve carget curve c)

c) target curve (design-goal)

EQUALIZATION FILTER COEFFICIENT DETERMINATOR, APPARATUS, EQUALIZATION FILTER COEFFICIENT PROCESSOR, SYSTEM AND METHODS

CROSS-REFERENCE TO RELATED APPLICATIONS

This application is a continuation of copending International Application No. PCT/EP2014/053480, filed Feb. 21, 2014, which is incorporated herein by reference in its entirety, and additionally claims priority from U.S. Application No. 61/768,724, filed Feb. 25, 2013, and European Application No. EP 13159563.9, filed Mar. 15, 2013, both of which are incorporated herein by reference in their entirety.

Some embodiments according to the invention are related to an equalization filter coefficient determinator for determining a current set of equalization filter target coefficients for use by an equalizer.

Some embodiments are related to an apparatus comprising a user interface, an equalization filter coefficient determinator and an equalizer.

Some embodiments according to the invention are related to an equalization filter coefficient processor.

Some embodiments are related to a system comprising an equalization filter coefficient processor and an equalization filter coefficient determinator.

Some embodiments are related to a method for determining a current set of equalization filter target coefficients for use by an equalizer.

Some embodiments according to the invention are related to a stepless adjustable headphone equalization based on principle component analysis (PCA).

BACKGROUND OF THE INVENTION

Sound transducers like, for example, headphones or loudspeakers are widely used for presenting audio signals to listeners. In some cases, the sound transducers are sold together with the equipment providing the audio signals to be presented by said sound transducers. However, in many cases, the sound transducers are bought separately by the customers, which often results in a degradation of the audio quality.

In the following, some problems will be outlined taking reference to headphones, which are one possible example of a sound transducer.

First of all, some general characteristics of headphones will be described. There are different types of headphones used in consumer and professional audio: insert ear-phones (intra-canal), ear-buds (intra-concha), on-ear (supra-aural) and over-the-ear (circum-aural). In mobile communications, headphones are often combined with microphones in one device in order to do hands-free voice calls. For simplicity, these "headsets" will be also referred to as headphones in this document.

Headphones are produced using various technologies and materials of different quality levels. These differences lead to different sound characteristics.

This is mainly due to the varying frequency responses produced by different headphones (see, for example, FIG. 9, which shows a frequency response of different headphones). Moreover, reference is also made to document [1]. For example, in the graphic representation 900 according to FIG. 9, an abscissa 910 describes a frequency (in the unit of Hertz) in a logarithmic manner. An ordinate 920 describes a level (or relative level) in the unit of decibels in a logarithmic manner. As can be seen, a curve 930 describes a so-called "diffuse-field" frequency response according to international standard ISO-11904-1. A second curve 932 describes the frequency response of a "high quality" headphone. A third curve 934 describes a frequency response of a "low-cost" headphone. As can be seen, the "high-quality" headphone comprises a frequency response which approximates the "diffuse-field" frequency response better than the frequency response of the "low-quality" headphone.

Moreover, it should be noted that the frequency response of a headphone is an important component of its perceived quality (see, for example, reference [2]).

Ideally, the headphones should be capable of providing a frequency response that follows a defined target curve, for example, diffuse field equalization (see, for example, reference [3]). Headphones that have a frequency response which strongly differs from an ideal frequency response are typically judged to have a bad audio quality.

The frequency response of a headphone can be identified, for example, by a measuring on a defined coupler (see, for example, reference [4]). The frequency response describes how much sound pressure is produced in the ear canal when a specific level electric voltage is fed to the headphones. The level of sound pressure is frequency-dependent.

Measuring these frequency responses of headphones is quite challenging. A dummy head equipped with ear-simulators or an acoustic coupler, special audio measurement hardware and software and appropriate knowledge is highly recommendable or even mandatory for proper results. Hence, measuring frequency responses of headphones should advantageously be made by professionals and not by consumers and/or end-users.

In the following, some conventional filters for headphones will be described. However, it should be noted that the filters can be used for any type of sound transducer.

The audio quality of headphones can be significantly improved. Therefore, the signal that is later fed to the headphones may be preprocessed. Each headphone shows a unique frequency response (see, for example, FIG. 10a). A specific filter for this headphone (see, for example, FIG. 10b) compensates for the imperfect frequency response, as described for example in reference [5]. This process is referred to as headphone equalization. Hence, the ideal quality of these headphones is raised by adapting the frequency response to a certain design goal (see, for example, FIG. 10c).

In the following, some details will be explained taking reference to FIG. 10, which shows a scheme for the generation of discrete filters for specific headphones. FIG. 10a shows a frequency response of a headphone. An abscissa 1010 describes a frequency in Hertz, and an ordinate 1012 describes a magnitude of the frequency response, for example, in a logarithmic form in decibels. A curve 1014 describes the frequency response of an example headphone. FIG. 10b shows a filter for the frequency response according to FIG. 10a to achieve a target curve according to FIG. 10c. In other words, FIG. 10b shows a frequency response of a filter or equalization filter, which can be used to achieve the overall target frequency response according to FIG. 10c when used to equalize an audio signal provided to the headphone having the frequency response according to FIG. 10a. An abscissa 1020 describes a frequency (for example, in Hertz) and an ordinate 1022 describes a (relative) magnitude of the filter response (for example, in the unit of decibels). A curve 1024 describes the frequency response of the equalization filter. FIG. 10c describes a target frequency response curve. An abscissa 1030 describes a frequency in Hertz, and an ordinate 1032 describes a magnitude of the target frequency response, for example, in decibels. A curve 1034 describes the target frequency response, which may, for example, approximate the diffuse-field frequency response according to ISO-11904-1.

It should be noted that the frequency response of an equalization filter, which filters (or equalizes) an audio signal to be output via a specific headphone, may be determined as the "difference" (or, more precisely, the quotient) between the target frequency response (as described, for example, in FIG. 10c) and the actual (measured) frequency response of the headphone currently under consideration (as shown, for example, in FIG. 10a). In other words, the target frequency response of the filter (equalizer filter) can be determined on the basis of the knowledge of the target frequency response curve and the actual frequency response curve of the headphone under consideration. Since the actual frequency response curves of different headphones differ, the associated equalization filter frequency response curves also differ.

Moreover, it should be noted that the technique described in reference [5] can be used to create different discrete filters for various headphones. Nevertheless, the conventional concepts for headphone equalization typically demand high skills from the operator and are hardly usable by inexperienced end users.

WO2010/138309 [8] describes an audio signal dynamic equalization processing control which, however, is computationally very complex and does not allow for the definition of temporally constant signal-independent equalization.

To summarize, it is conventionally not possible or very difficult for an end user to properly adjust the filter coefficients of an equalization filter to obtain a good hearing impression using headphones.

Accordingly, there is a desire to create a concept which makes it easier for an end user to obtain a reasonably good set of filter coefficients for an equalization filter to improve the (effective) frequency response of a given sound transducer (like, for example, a headphone) using an equalizer.

SUMMARY

An embodiment may have an equalization filter coefficient determinator for determining a current set of equalization filter coefficients for use by an equalizer, wherein the equalization filter coefficient determinator is configured to continuously or quasi-continuously fade between a plurality of different equalizer settings in dependence on one or more setting parameters, to acquire the current set of equalization filter coefficients, wherein a current equalizer setting is described by the current set of equalization filter target coefficients, and wherein a number of setting parameters is smaller than a number of equalization filter target coefficients of the current set of equalization filter target coefficients; wherein the equalization filter coefficient determinator is configured to acquire the one or more setting parameters from a user interface, wherein the equalization filter coefficient determinator is configured to allow a user to continuously or quasi-continuously fade between a plurality of different equalizer settings in dependence on the one or more setting parameters, such that the user can directly adjust the equalizer setting by varying the one or more setting parameters; wherein the equalization filter coefficient determinator is configured to variably combine N' principle components of N sets of reference equalization filter target coefficients in dependence on the one or more setting parameters, in order to acquire the current set of equalization filter target coefficients, wherein $N' \geq 2$, and wherein $N > N'$; or wherein the equalization filter coefficient determinator is configured to variably combine a first set of equalization filter target coefficients, which is a mean of a plurality of N sets of reference equalization filter target coefficients, and a second set of equalization filter target coefficients, which is a first principal component of the plurality of N sets of reference equalization filter target coefficients, in dependence on one setting parameter, in order to acquire the current set of equalization filter target coefficients.

Another embodiment may have an equalization filter coefficient determinator for determining a current set of equalization filter target coefficients for use by an equalizer, wherein the equalization filter coefficient determinator is configured to linearly combine a plurality of equalization filter target coefficient set components in dependence on one or more setting parameters, to acquire the current set of equalization filter target coefficients, wherein a current equalizer setting is described by the current set of equalization filter target coefficients, and wherein a number of setting parameters is smaller than a number of equalization filter target coefficients of the current set of equalization filter target coefficients.

Another embodiment may have an equalization filter coefficient determinator for determining a current set of equalization filter target coefficients for use by an equalizer, wherein the equalization filter coefficient determinator is configured to acquire the current set of equalization filter target coefficients in dependence on a two-dimensional position information or a three-dimensional position information acquired using a two-dimensional or three-dimensional user input device; wherein the equalization filter coefficient determinator is configured to continuously or quasi-continuously fade between a plurality of different equalizer settings in dependence on two or three setting parameters derived from the position information, to acquire the current set of equalization filter target coefficients, or wherein the equalization filter coefficient determinator is configured to linearly combine a plurality of equalization filter set components in dependence on two or three setting parameters derived from the position information, to acquire the current set of equalization filter target coefficients.

According to another embodiment, an apparatus may have: a user interface, wherein the user interface is configured to acquire one or more setting parameters in response to a user interaction; an equalization filter coefficient determinator according to claim 1, wherein the equalization filter coefficient determinator is configured to receive the setting parameters from the user interface; an equalizer configured to receive a current set of equalization filter target coefficients from the equalization filter coefficient determinator, and to equalize an audio signal to be output by a sound transducer on the basis of the received set of equalization filter target coefficients.

According to another embodiment, an apparatus may have: a user interface, wherein the user interface is configured to acquire one or more setting parameters in response to a user interaction; an equalization filter coefficient determinator according to claim 12, wherein the equalization filter coefficient determinator is configured to receive the setting parameters from the user interface; an equalizer configured to receive a current set of equalization filter target coefficients from the equalization filter coefficient determinator, and to equalize an audio signal to be output by a sound transducer on the basis of the received set of equalization filter target coefficients.

According to another embodiment, an apparatus may have: a user interface, wherein the user interface is configured to acquire one or more setting parameters in response to a user interaction; an equalization filter coefficient determinator according to claim 15, wherein the equalization filter coefficient determinator is configured to receive the setting parameters from the user interface; an equalizer configured to receive a current set of equalization filter target coefficients from the equalization filter coefficient determinator, and to equalize an audio signal to be output by a sound transducer on the basis of the received set of equalization filter target coefficients.

Another embodiment may have an equalization filter coefficient processor, wherein the equalization filter coefficient processor is configured to acquire N sets of reference equalization filter target coefficients; and wherein the equalization filter coefficient processor is configured to determine N' sets of basis equalization filter target coefficients representing a plurality of characteristic features of the of the N sets of reference equalization filter target coefficients; and wherein the equalization filter coefficient processor is configured to provide the N' sets of basis equalization filter target coefficients to an equalization filter coefficient determinator for the derivation of a current set of equalization filter target coefficients; wherein $N' \geq 2$, and wherein $N > N'$.

According to another embodiment, a system may have: an equalization filter coefficient processor according to claim 17; and an equalization filter coefficient determinator according to claim 1.

According to another embodiment, a system may have: an equalization filter coefficient processor according to claim 17; and an equalization filter coefficient determinator according to claim 12.

According to another embodiment, a system may have: an equalization filter coefficient processor according to claim 17; and an equalization filter coefficient determinator according to claim 15.

Another embodiment may have a method for determining a current set of equalization filter target coefficients for use by an equalizer, which method may have the step of: continuously or quasi-continuously fading between a plurality of different equalizer settings in dependence on one or more setting parameters, to acquire the current set of equalization filter target coefficients, wherein a current equalizer setting is described by the current set of equalization parameters, and wherein a number of setting parameters is smaller than a number of equalization filter target coefficients of the current set of equalization filter target coefficients; wherein the one or more setting parameters are acquired from a user interface, to allow a user to continuously or quasi-continuously fade between a plurality of different equalizer settings in dependence on the one or more setting parameters, and such that the user can directly adjust the equalizer setting by varying the one or more setting parameters; wherein the method comprises variably combining N' principle components of N sets of reference equalization filter target coefficients in dependence on the one or more setting parameters, in order to acquire the current set of equalization filter target coefficients, wherein $N' \geq 2$, and wherein $N > N'$; or wherein the method comprises variably combining a first set of equalization filter target coefficients, which is a mean of a plurality of N sets of reference equalization filter target coefficients, and a second set of equalization filter target coefficients, which is a first principal component of the plurality of N sets of reference equalization filter target coefficients, in dependence on one setting parameter, in order to acquire the current set of equalization filter target coefficients.

Another embodiment may have a method for determining a current set of equalization filter target coefficients for use by an equalizer, which method may have the step of: linearly combining a plurality of equalization filter target coefficient set components in dependence on one or more setting parameters, to acquire the current set of equalization filter target coefficients, wherein a current equalizer setting is described by the current set of equalization filter target coefficients, and wherein a number of setting parameters is smaller than a number of equalization filter target coefficients of the current set of equalization filter target coefficients.

Another embodiment may have an equalization filter coefficient determinator for determining a current set of equalization filter coefficients for use by an equalizer, wherein the equalization filter coefficient determinator is configured to continuously or quasi-continuously fade between a plurality of different equalizer settings in dependence on one or more setting parameters, to acquire the current set of equalization filter coefficients, wherein a current equalizer setting is described by the current set of equalization filter target coefficients, and wherein a number of setting parameters is smaller than a number of equalization filter target coefficients of the current set of equalization filter target coefficients; wherein the equalization filter coefficient determinator is configured to acquire the one or more setting parameters from a user interface, wherein the equalization filter coefficient determinator is configured to allow a user to continuously or quasi-continuously fade between a plurality of different equalizer settings in dependence on the one or more setting parameters, such that the user can directly adjust the equalizer setting by varying the one or more setting parameters; wherein the equalization filter coefficient determinator is configured to continuously or quasi-continuously fade between a plurality of different sets of equalization filter target coefficients, which are representative sets of equalization filter target coefficients associated with different models of one type of sound transducers, in dependence on one or more setting parameters, to acquire the current set of equalization filter target coefficients.

Another embodiment may have a method for determining a current set of equalization filter target coefficients for use by an equalizer, which method may have the step of: continuously or quasi-continuously fading between a plurality of different equalizer settings in dependence on one or more setting parameters, to acquire the current set of equalization filter target coefficients, wherein a current equalizer setting is described by the current set of equalization parameters, and wherein a number of setting parameters is smaller than a number of equalization filter target coefficients of the current set of equalization filter target coefficients; wherein the one or more setting parameters are acquired from a user interface, to allow a user to continuously or quasi-continuously fade between a plurality of different equalizer settings in dependence on the one or more setting parameters, and such that the user can directly adjust the equalizer setting by varying the one or more setting parameters; wherein the method comprises continuously or quasi-continuously fading between a plurality of different sets of equalization filter target coefficients, which are representative sets of equalization filter target coefficients associated with different models of one type of sound transducers, in dependence on one or more setting parameters, to acquire the current set of equalization filter target coefficients.

Another embodiment may have a computer program for performing the method according to claim 26 when the computer program runs on a computer.

Another embodiment may have a computer program for performing the method according to claim 27 when the computer program runs on a computer.

Another embodiment may have a computer program for performing the method according to claim 29 when the computer program runs on a computer.

An embodiment according to the invention creates an equalization filter coefficient determinator for determining a current set of equalization filter target coefficients for use by an equalizer, wherein the equalization filter target coefficients may, for example, describe a frequency response of the equalizer, or wherein the equalization filter target coefficients may, for example, be equal to filter coefficients of the equalizer. The equalization filter coefficient determinator is configured to continuously or quasi-continuously fade between a plurality of different equalizer settings in dependence on one or more setting parameters, to obtain the current set of equalization filter target coefficients. A current equalizer setting is described by the current set of equalization filter target coefficients. A number of setting parameters is smaller than a number of equalization filter target coefficients of the current set of equalization filter target coefficients.

This embodiment according to the invention is based on the finding that a continuous or quasi-continuous fading between a plurality of different equalizer settings in response to a comparatively small number of setting parameters, which is smaller than a number of equalization filter target coefficients, allows even inexperienced users to find a reasonably good set of equalization filter parameters.

In other words, this embodiment according to the invention is based on the finding that even inexperienced users are typically able to find a reasonably good equalizer setting if a continuous or quasi-continuous fade between a plurality of different equalizer settings is possible on the basis of a comparatively small number of setting parameters, wherein the number of setting parameters is smaller than the number of equalization filter target coefficients. It has been found that the comparatively high number of equalization filter target coefficients, which should be used to obtain a reasonably good equalization filter, cannot be easily handled by a user. Accordingly, the above described embodiment according to the invention allows the user to continuously or quasi-continuously fade between a plurality of different equalizer settings (which are defined by a respective current set of equalization filter target coefficients) in dependence on only a comparatively small number of setting parameters, which significantly facilitates the handling for the user. Also, a number of degrees of freedom is reduced by continuously or quasi-continuously fading between a plurality of different equalizer settings in dependence on one or more setting parameters, wherein the number of setting parameters is smaller, or even significantly smaller, than the number of equalization filter target coefficients. Thus, the user can directly adjust the equalizer settings by varying the one or more setting parameters, without being faced with the typically very high number of equalization filter parameters. In other words, a change of a setting parameter directly and unambiguously controls the equalizer setting in that it controls a fading between a plurality of different equalizer settings while keeping the complexity for the user (and the number of degrees of freedom) small. Accordingly, a user-friendly concept for the adjustment of the equalization filter target coefficients is provided, which in turn results in a good user satisfaction. Also, a computational complexity is comparatively small, such that simple hardware is typically sufficient. Also, the setting of the equalization filter target coefficients is typically independent from the audio signal, which facilitates the adjustment for the user.

It should also be noted that the equalization filter target coefficients may, for example, represent a frequency response of an equalization filter. For example, the equalization filter target coefficients may represent an amplitude of the filter response for different frequencies. For example, the individual equalization filter target coefficients may (individually) represent an amplitude (and, optionally, also a phase) of the filter response for a plurality of respective frequencies or frequency ranges. In other words, the values of the equalization filter target coefficients may directly represent the amplitudes of the filter response, wherein each of the equalization filter target coefficients may be associated with a frequency or a frequency range and represent an amplitude (and, optionally, also a phase) for its associated frequency or frequency range. In other words, in some cases, the equalization filter target coefficients may be frequency-domain filter coefficients, representing a filter response for different frequencies, and may be directly applicable to frequency domain components of an audio signal. Alternatively, however, the equalization filter target coefficients may be time-domain filter coefficients, representing coefficients of a finite impulse response filter or of an infinite impulse response filter, and may be directly applicable in a finite impulse response filter or an infinite impulse response filter. Alternatively, the equalization filter target coefficients may be input to a conversion process, wherein filter coefficients for a finite impulse response filter or an infinite impulse response filter are designed based on the equalization filter target coefficients.

In an advantageous embodiment, the equalization filter coefficient determinator is configured to continuously or quasi-continuously fade between a plurality of different equalizer settings in dependence on a single setting parameter. By using a single setting parameter only to continuously or quasi-continuously fade between a plurality of different equalizer settings, a user interface for adjusting the single setting parameter can be very simple. Also, even an inexperienced user can easily vary a single setting parameter and decide for which setting of the single setting parameter an equalizer setting defined by said single setting parameter provides a reasonably good hearing impression. Thus, the usage of a single setting parameter, which controls a continuous or quasi-continuous fade between a plurality of different equalizer settings (i.e., a continuous or quasi-continuous fade between different sets of equalization filter target coefficients) facilitates the design of a user interface, simplifies the user interaction and improves the user satisfaction.

In an advantageous embodiment, the equalization filter target coefficients are associated with different frequencies or frequency ranges. In this case, the equalization filter coefficient determinator is configured such that a change of the single setting parameter varies equalization filter target coefficients (of a set of equalization filter coefficients) associated with at least one half of an entire frequency range covered by the set of equalization filter target coefficients. In other words, the single setting parameter directly changes the set of equalization filter target coefficients over a "broad" frequency range, which allows to fade between substantially different equalizer settings using the single setting parameter. Accordingly, a wide variety of substantially different equalizer settings can be chosen using the single setting parameter, which allows to adapt the equalizer setting to a large variety of sound transducers. Consequently, by adjusting the equalization filter target coefficients over a wide frequency range in dependence on the single setting parameter, it is easy for a user to adapt the current equalizer setting described by the current set of equalization parameters to the currently used sound transducer.

In an advantageous embodiment, the equalization filter coefficient determinator is configured to obtain the one or more setting parameters from one or more sliders, or to obtain the one or more setting parameters from one or more knobs. Accordingly, the setting parameters can be input in a user-friendly manner.

In an advantageous embodiment, the equalization filter coefficient determinator is configured to obtain the one or more setting parameters from one or more sliders implemented using a touchscreen. This configuration allows a user friendly adjustment of the equalizer setting using modern multimedia devices.

In an advantageous embodiment, the equalization filter coefficient determinator is configured to obtain two or three setting parameters on the basis of a two-dimensional position information or a three-dimensional position information, wherein the two-dimensional position information or the three-dimensional position information is obtained using a two-dimensional user input device or a three-dimensional user input device. Accordingly, a two-dimensional user input device or a three-dimensional user input device can be used to directly define the equalization setting, i.e. a plurality of equalization filter target coefficients. The usage of a two-dimensional user input device allows for a definition of two setting parameters, which in turn provides two degrees of freedom for the continuous or quasi-continuous fading between different equalizer settings. Accordingly, there is more flexibility in the user-based definition of the different equalizer settings when compared to the usage of a single setting parameter. Also, it has been found that a two-dimensional user input device is still user-friendly and allows for an efficient adjustment of the equalizer settings for a very large variety of sound transducers. Usage of a three-dimensional user input device also provides for good results since a three-dimensional user input device still allows for an intuitive handling. Also, it has been found that three setting parameters are still manageable by a user.

In an advantageous embodiment, a number of equalization filter target coefficients is larger than 15 or larger than 63 or larger than 255 or even larger than 1023. It has been found that a number of equalization filter target coefficients should be chosen comparatively large in order to be able to compensate an imperfect frequency response of a sound transducer. It has also been found that usage of a comparatively large number of equalization filter target coefficients is compatible with a frequency domain sound processing (for example, frequency domain sound encoding/decoding), wherein the equalization filter target coefficients may be spectral domain filter coefficients affecting different spectral bins. Moreover, it has been found that a number of equalization filter target coefficients should be chosen large enough to avoid undesirable artifacts which would result from an insufficiently small number of filter coefficients.

In an advantageous embodiment, the equalization filter target coefficients are chosen at frequency points that are relevant for the human hearing. It is known that the frequency resolution of the human hearing is not linear. Therefore, equalization filter target coefficients could be defined at frequencies that are not equally distributed on a linear frequency axis. It has been found that a third-octave or a critical band resolution may be useful. However, this concept may not need to be used in combination with a fixed equally distributed filter bank, which is used in some implementations of the equalizer (wherein the equalization may be applied to a frequency domain representation of the input audio signal). Nevertheless, the concept may be meaningful for some implementations, like, for example, implementations in which a time domain processing is performed by the equalizer.

In an advantageous embodiment, a number of equalization filter target coefficients is larger, at least by a factor of 16, or at least by a factor of 64, or at least by a factor of 256, than a number of setting parameters. It has been found that the concept to fade between a plurality of different equalization settings in dependence on one or more setting parameters brings along particularly good results, and a particularly large advantage, if the number of equalization filter target coefficients is substantially larger than a number of setting parameters.

In an advantageous embodiment, the equalization filter coefficient determinator is configured to add a weighted version of a second set of equalization filter target coefficients, weighted in dependence on one of the one or more (variable) setting parameters, to a first set of equalization filter target coefficients, to obtain the current set of equalization filter target coefficients. It has been found that such a simple combination of the first set of equalization filter parameters (which may be considered as a first equalization filter target coefficient set component) and of the second set of equalization filter parameters (which may be considered as a second equalization filter target coefficient set component) is computationally very efficient but nevertheless provides for a sufficient flexibility in the adjustment of the set of equalization filter target coefficients.

In an advantageous embodiment, the first set of equalization filter target coefficients and the second set of equalization filter target coefficients are principle components of more than two sets of reference equalization filter target coefficients. It has been found that a linear combination of two or more sets of equalization filter target coefficients (which may be considered as equalization filter target coefficient set components), which are principle components of more than two sets of reference equalization filter target coefficients, allows to obtain a current set of equalization filter target coefficients which is well-adapted to a large number of sound transducers. It has been found that equalization filter target coefficients which are principle components of more than two sets of reference equalization filter target coefficients reflect the most significant characteristics of the sets of reference equalization filter target coefficients. Accordingly, the first set of equalization filter target coefficients and the second set of equalization filter target coefficients (and possibly additional sets of equalization filter target coefficients) are well-suited to obtain, using a linear combination, a current set of equalization filter target coefficients which is adapted to typical characteristics of a sound transducer. For example, the first set of equalization filter target coefficients may represent, or approximate, a mean (or average) of the sets of reference equalization filter target coefficients. Moreover, the second set of equalization filter target coefficients may, for example, represent a most characteristic deviation of the different sets of reference equalization filter target coefficients from said mean (or average). Thus, by adding a variably weighted version of the second set of equalization filter target coefficients to the first set of equalization filter target coefficients, the current set of equalization filter parameters may be faded from the average of the sets of reference equalization filter target coefficients to another equalization setting which exhibits a "typical" (or "most characteristic") deviation from said average (or mean).

In an advantageous embodiment, the equalization filter coefficient determinator is configured to variably combine N' principle components of N sets of reference equalization filter target coefficients in dependence on the one or more setting parameters, in order to obtain the current set of equalization filter target coefficients, wherein N'≥2, and wherein N>N'. By variably combining (for example, linearly combining) N' principle components of a comparatively large number of N sets of reference equalization filer coefficients, the most significant characteristics of the N sets of reference equalization filter target coefficients, which are typically associated with reference sound transducers, can be considered when determining the current set of equalization filter target coefficients, because the most important and/or most significant characteristics of the N sets of reference equalization filter target coefficients are reflected in the N' principle components (wherein each of the N' principle components is typically a set of equalization filter target coefficients, and con be considered as an equalization filter target coefficient set component). Thus, the information about (or included in) the comparatively large number of N sets of reference equalization filter target coefficients can be exploited, even though only a comparatively smaller number N' of principle components is combined (which, in turn, may use only a comparatively small number of setting parameters, for example N'–1 setting parameters or N' setting parameters). Consequently, it is possible to exploit the information contained in the comparatively large number of N sets of reference equalization filter target coefficients, even though only a comparatively small (and consequently user friendly) number of setting parameters is used.

In an advantageous embodiment, the equalization filter coefficient determinator is configured to variably combine a first set of equalization filter target coefficients, which is a mean of a plurality of N sets of reference equalization filter target coefficients, and a second set of equalization filter target coefficients, which is a first principle component of the plurality of N sets of reference equalization filter target coefficients, in dependence on one setting parameter (or even in dependence on a single setting parameter) in order to obtain the current set of equalization filter target coefficients. Using such a combination, the current set of equalization filter target coefficients can be well-adapted to a large number of different sound transducers using a small number of setting parameters (for example, only a single setting parameter or only a few setting parameters).

In an advantageous embodiment, the equalization filter coefficient determinator is configured to continuously or quasi-continuously fade between a plurality of different sets of equalization filter target coefficients in dependence on one or more setting parameters, to obtain the current set of equalization filter target coefficients, wherein a first one of the different sets of equalization filter target coefficients is based on a first cluster of sets of reference equalization filter target coefficients, and wherein a second one of the different sets of equalization filter target coefficients is based on a second cluster of sets of reference equalization filter target coefficients. It has been found that fading between such different sets of equalization filter target coefficients allows to provide current sets of equalization filter target coefficients which are well-adapted to a large number of different sound transducers. It has been found that equalization filter target coefficients, which lie "in between" clusters (or centers of clusters) of sets of reference equalization filter target coefficients associated with reference sound transducers are well-adapted to many different sound transducers, because many different sound transducers have characteristics which lie "in between" the characteristics of "typical" reference sound transducers. Accordingly, this concept allows for a user-friendly setting of equalization filter target coefficients which are well-adapted to the sound transducers.

In an advantageous embodiment, a first one of the different sets of equalization filter target coefficients is a representative set of equalization filter target coefficients, representing the sets of equalization filter target coefficients of the first cluster, and the second one of the different sets of equalization filter target coefficients is a representative set of equalization filter target coefficients, representing the sets of equalization filter target coefficients of the second cluster. For example, the first one of the different sets of equalization filter target coefficients may be a "central" set of equalization filter target coefficients of the first cluster, or may be a mean (or average) set of equalization filter target coefficients of the first cluster. Similarly, the second set of equalization filter target coefficients may be a central set of equalization filter target coefficients of the second cluster or a mean (or average) set of equalization filter target coefficients of the second cluster. Accordingly, a meaningful fade between different sets of equalization filter target coefficients can be achieved.

In an advantageous embodiment, the equalization filter coefficient determinator is configured to continuously or quasi-continuously fade between a plurality of different sets of equalization filter target coefficients, which are representative sets of equalization filter target coefficients associated with different types of sound transducers, in dependence one or more setting parameters, to obtain the current set of equalization filter target coefficients. By generally fading between a plurality of different sets of equalization filter target coefficients, which are representative sets of equalization filter target coefficients associated with different types of sound transducers (for example, different models of sound transducers, or even different construction forms of sound transducers), it can be reached that the current set of equalization parameters can be adapted to many different sound transducers with only simple user interaction (for example, modification of a small number of setting parameters).

In an advantageous embodiment, the equalization filter coefficient determinator is configured to adjustably combine a plurality of different sets of filter coefficients, which describe equalization filters associated with a compensation of different characteristic features (or, equivalently, characteristic imperfections) of sound transducers, in dependence on one or more setting parameters, to obtain the current set of equalization filter target coefficients. By combining (for example, by linearly combining) a plurality of different sets of equalization filter target coefficients, which describe equalization filters associated with a compensation of different characteristic features of sound transducers, in dependence on only a small number of setting parameters, it is possible even for an inexperienced user to find an appropriate current set of equalization parameters which is adapted to the different characteristic features (or imperfections) of the currently used sound transducer. For example, a first set of equalization filter parameters may be adapted for compensating a specific feature (or imperfection) of a sound transducer (or of the transfer function thereof) in a low frequency range, and a second set of equalization filter target coefficients may be adapted to compensate a specific high frequency range characteristic (or imperfection) of a sound transducer. Accordingly, a user may adjustably fade between a first set of equalization filter target coefficients resulting in (or adapted to) the compensation of the specific low frequency range feature and a second set of equalization filter target coefficients resulting in (or adapted to) the compensation of the specific high frequency range feature, to identify a current set of equalization filter target coefficients which provides an appropriate trade off between a compensation of the low frequency range characteristic feature and a compensation of the high frequency range characteristic feature, and which is adapted to the characteristics of the currently used sound transducer. In other words, by using this concept, a tradeoff between sets of equalization filter target coefficients can be found which are adapted for compensation of different characteristic features (or imperfections) of sound transducers, wherein a user can easily handle the setting.

In another advantageous embodiment, the equalization filter coefficient determinator is configured to adjustably combine one or more sets of equalization filter target coefficients, which describe equalization filters associated with a compensation of different characteristic features of sound transducers, with a basic set of equalization filter target coefficients in dependence on one or more setting parameters, to obtain the current set of equalization filter target coefficients. By considering both a basic set of equalization filter target coefficients and one or more sets of equalization filter target coefficients, which describe equalization filters associated with a compensation of different characteristic features of sound transducers (like, for example, low frequency range characteristic features, high frequency range characteristic features, resonance characteristic features and so on), particularly good setting results can be obtained. By considering the basic set of equalization filter target coefficients (which may, for example, describe a set of average equalization filter target coefficients associated with a plurality of reference sound transducers), a moderate equalization may be achieved which avoids that a current set of equalization filter target coefficients introduces an unacceptably bad sound quality. Nevertheless, the basic set of equalization filter target coefficients can be adapted to one or more specific characteristics of the currently used sound transducer by attributing a comparatively high weight to the one or more sets of equalization filter target coefficients which describe equalization filter target coefficients associated with a compensation of one or more different characteristic features of sound transducers (for example, by an appropriate adjustment of the setting parameters).

An embodiment according to the invention creates an equalization filter coefficient determinator for determining a current set of equalization filter target coefficients for use by an equalizer. The equalization filter coefficient determinator is configured to linearly combine a plurality of equalization filter target coefficient set components in dependence on one or more setting parameters, to obtain the current set of equalization filter target coefficients. A current equalizer setting is described by the current set of equalization filter target coefficients. A number of setting parameters is smaller than a number of equalization filter target coefficients of the current set of equalization filter target coefficients.

This embodiment according to the invention is based on the finding that a linear combination of a plurality of equalization filter target coefficient set components (i.e., of components of an equalization filter target coefficient sets) allows for a user-specified adjustment of the current set of equalization filter target coefficients with small computational effort but still with a good result. It should be noted that different types of equalization filter target coefficient set components can be used. For example, the equalization filter target coefficient set components may be sets of equalization filter target coefficients associated with different reference sound transducers. Alternatively, however, the equalization filter target coefficient set components may be sets of equalization filter target coefficients obtained using a principle component analysis or a cluster analysis of a plurality of sets of reference equalization filter target coefficients. For example, the equalization filter target coefficient set components may be principle components extracted from a plurality of sets of reference equalization filter target coefficients associated with reference sound transducers. Thus, one of the equalization filter target coefficient set components may be a first principle component or an average of a plurality of sets of reference equalization filter target coefficients. Another one of the equalization filter target coefficient set components may be a second principle component of the sets of reference equalization filter target coefficients. Alternatively, however, the equalization filter target coefficient set components may be sets of filter coefficients representing a plurality of clusters identified on the basis of a plurality of sets of reference equalization filter target coefficients. Thus, by linearly combining a plurality of equalization filter target coefficient set components (i.e., sets of equalization filter target coefficients which form the basis of the linear combination, or which form basis vectors of the linear combination), a current set of equalization filter target coefficients can be obtained which is well-adapted to a currently used sound transducer in dependence on only a small number of variable setting parameters. In some cases, a single setting parameter may be sufficient to define the linear combination of the equalization filter target coefficient set component, wherein the current set of equalization filter target coefficients is directly obtained as a result of said linear combination of the equalization filter target coefficient set components.

In an advantageous embodiment, the equalization filter coefficient determinator is configured to linearly combine the plurality of equalization filter target coefficient set components in dependence on a single setting parameter. Thus, the current set of equalization filter target coefficients is obtained, for example, as an immediate result of a very simple linear combination with only one degree of freedom. However, it has been found that sets of equalization filter target coefficients, which are well-adapted to many common sound transducers, can be obtained on the basis of only one single variable setting parameter.

In an advantageous embodiment, the equalization filter target coefficients are associated with different frequencies or frequency ranges. In this case, the equalization filter coefficient determinator is configured such that a change of the single setting parameter varies equalization filter target coefficients of the set of equalization filter target coefficients associated with at least one half of an entire frequency range covered by the set of equalization filter target coefficients. It has been found that the current set of equalization filter target coefficients can be adapted to different types of sound transducers using only a single setting parameter by varying equalization filter target coefficients of a "broad" frequency range (for example, as broad as two thirds of an entire audio frequency range) in dependence on said single setting parameter.

In an advantageous embodiment, the equalization filter coefficient determinator is configured to obtain the single setting parameter from a single slider, or to obtain the single setting parameter from a single knob. This makes the concept particularly user-friendly.

In an advantageous embodiment, the equalization filter coefficient determinator is configured to add a weighted version of a second set of equalization filter target coefficients, weighted in dependence on one of the one or more variable setting parameters, to a first set of equalization filter target coefficients, to obtain the current set of equalization filter target coefficients. Using this concept, a particularly simple linear combination can be obtained. For example, the first set of equalization filter target coefficients may be a constant set of equalization filter target coefficients. Accordingly, the current set of equalization filter target coefficients may be obtained by a superposition of said (constant, and advantageously constantly weighted) first set of equalization filter target coefficients and the variably weighted version of the second set of equalization filter target coefficients. Thus, the first set of equalization filter target coefficients may determine an "average" set of equalization filter target coefficients, and the second set of equalization filter target coefficients may determine a deviation from said average. However, a computational simple and user-friendly mechanism for the adjustment of the current set of equalization filter parameters is obtained by using this concept.

In an advantageous embodiment, the equalization filter coefficient determinator is configured to add a weighted version of a second set of equalization filter target coefficients, weighted in dependence on a single variable setting parameter, to a first set of equalization filter target coefficients, to obtain the current set of equalization filter target coefficients. In this case, a weighting of the first set of equalization filter target coefficients may be fixed.

Another embodiment according to the invention creates an equalization filter coefficient determinator for determining a current set of equalization filter target coefficients for use by an equalizer. In this embodiment, the equalization filter coefficient determinator is configured to obtain the current set of equalization filter target coefficients in dependence on a two-dimensional position information or a three-dimensional position information obtained using a two-dimensional or three-dimensional user input device. The equalization filter coefficient determinator is configured to continuously or quasi-continuously fade between a plurality of different equalizer settings in dependence on two or three setting parameters, to obtain the current set of equalization filter target coefficients, or to linearly combine a plurality of equalization filter target coefficient set components (as defined above) in dependence on two or three setting parameters, to obtain the current set of equalization filter target coefficients. This embodiment according to the invention provides an intuitive user interface for the adjustment of equalization filter target coefficients. By providing two or three degrees of freedom for the adjustment of the set of equalization filter target coefficients, a sufficiently detailed adjustment is possible without deterring an inxperienced user.

In an advantageous embodiment, the equalization filter coefficient determinator is configured to derive two setting parameters from the two-dimensional position information, or to derive three setting parameters from the three-dimensional position information. In this case, the equalization parameter determinator is configured to obtain the current set of equalization filter target coefficients on the basis of the two setting parameters or on the basis of the three setting parameters. For example, the two setting parameters or the three setting parameters may be used to directly derive a current set of equalization filter target coefficients by combining a plurality of equalization filter target coefficient set components.

An embodiment according to the invention creates an apparatus comprising a user interface, an equalization filter coefficient determinator and an equalizer. The user interface is configured to obtain one or more setting parameters in response to a user interaction. The equalization filter coefficient determinator may be equivalent to one of the equalization filter coefficient determinators described above. In particular, the equalization filter coefficient determinator may be configured to receive the one or more setting parameters from the user interface. Moreover, the equalizer is configured to receive a current set of equalization filter target coefficients from the equalization filter coefficient determinator, and to equalize an audio signal to be output by a sound transducer on the basis of the received set of equalization filter target coefficients. Accordingly, the apparatus allows for an immediate feedback to the user unteraction provided via the user interface. For example, the equalization filter target coefficients used by the equalizer may be adapted just-in-time (i.e., as fast as possible) in response to a user's input via the user interface. Accordingly, the user may have instantaneous or quasi-instantaneous feedback how an input from the user interface affects the equalization performed by the equalizer. In particular, the simple determination of the equalization filter target coefficients, which is performed by the equalization filter coefficient determinator, results in very fast and resource-efficient computation of the equalization filter target coefficients for usage by the equalizer in response to a user input. User input from the user interface may, for example, define the setting parameters discussed above, wherein the equalization filter coefficient determinator fades between different equalizer settings in dependence on the setting parameters. For example, the setting parameters may determine a linear combination of equalization filter target coefficient set components, wherein the current set of equalization filter target coefficients may be derived in a very simple and fast manner by this variable linear combination of equalization filter target coefficient set components. Thus, it can be seen that the apparatus comprising a user interface, the equalization filter coefficient determinator and the equalizer is very well-adapted for a just-in-time adjustment of the current set of equalization parameters and therefore allows even inexperienced users to achieve a reasonable equalizer setting with little effort and using a simple user interface.

An embodiment according to the invention creates an equalization filter coefficient processor. The equalization filter coefficient processor is configured to obtain (for example, receive or generate) N sets of reference equalization filter target coefficients. The equalization filter coefficient processor is also configured to determine N' sets of basis equalization filter target coefficients representing a plurality of characteristic features of the N sets of reference equalization filter target coefficients. The equalization filter coefficient processor is configured to provide the N' sets of basis equalization filter target coefficients to an equalization filter coefficient determinator for the derivation of a current set of equalization filter target coefficients. Advantageously, N' is larger than or equal to two, and N is larger than N'. This equalization filter coefficient processor provides basis equalization filter target coefficients which can be used by the equalization filter coefficient determinator as described above. The N' sets of basis equalization filter target coefficients may represent characteristic features of the N sets of reference equalization filter target coefficients in many different manners. For example, the N' sets of basis equalization filter target coefficients may represent a mean of the N sets of reference equalization filter target coefficients, and may also represent one or more characteristic deviations from this mean. This can be obtained, for example, if the N' sets of basis equalization filter target coefficients are provided to be principle components of the N sets of reference equalization filter target coefficients. However, the N' sets of basis equalization filter target coefficients may also represent a clustering of the N sets of reference equalization filter target coefficients, wherein the clusters are considered as characteristic features of the N sets of reference equalization filter target coefficients. However, different characteristic features may also be described by the basis equalization filter characteristics, like, for example, a characteristic evolution of an equalizer setting in a low-frequency range, a characteristic evolution of an equalizer setting in a high-frequency range, a characteristic equalizer setting in an environment of a resonance frequency, or the like. Thus, the equalization filter coefficient processor may be configured to provide the sets of basis equalization filter target coefficients such that a comparatively small number of basis equalization filter target coefficients describes a plurality of characteristic features of the comparatively larger number of sets of reference equalization filter target coefficients. Thus, number of sets of basis equalization filter target coefficients that may be used for approximating, with sufficiently good accuracy, a large number of sets of reference equalization filter target coefficients is kept small, which facilitates the adjustment of the current set of equalization filter target coefficients using the equalization filter coefficient determinator.

In an advantageous embodiment, the equalization filter coefficient processor is configured to perform a principle component analysis on the basis of the N sets of reference equalization filter target coefficients, to obtain the N' sets of basis equalization filter target coefficients. As discussed above, the usage of principle components of the N sets of reference equalization filter target coefficients as basis equalization filter target coefficients (also designated as equalization filter target coefficient set components) allows for a computationally efficient adjustment of the current set of equalization filter target coefficients on the basis of the user-provided setting parameters.

In another advantageous embodiment, the equalization filter coefficient processor is configured to perform a cluster analysis on the basis of the N sets of reference equalization filter target coefficients, to obtain the N' sets of basis equalization filter target coefficients, such that the N' sets of basis equalization filter target coefficients are associated with N' clusters. Basis equalization filter target coefficients which are associated with clusters (or, equivalently, represent clusters) are a very efficient basis for the determination of a current set of equalization filter target coefficients using the equalization filter coefficient determinator. For example, a basis equalization filter coefficient which represents a "center" or a "mean" of a cluster may be a good basis for a linear interpolation. Thus, cluster analysis is a good concept for providing basis equalization filter target coefficients for a derivation of a current set of equalization filter target coefficients using the equalization filter coefficient determinator described above.

In an advantageous embodiment, the equalization filter coefficient processor is configured to derive the N sets of reference equalization filter target coefficients from measured reference transfer characteristics of a plurality of reference sound transducers using one or more target transfer characteristics. In other words, the reference equalization filter target coefficients may be derived from measured reference transfer characteristics of a plurality of reference sound transducers, wherein the sets of reference equalization filter target coefficients describe which equalizer settings should be used in combination with the reference sound transducers to obtain an overall transfer characteristic which matches the target transfer characteristic. Thus, the sets of reference equalization filter target coefficients are well-adapted to the reference sound transducers and compensate for the imperfections of the transfer characteristics of the reference sound transducers. Accordingly, the N' sets of basis equalization filter target coefficients form a very good basis for a simple derivation of the current set of equalization filter target coefficients using the equalization filter coefficient determinator described above.

An embodiment according to the invention creates a system comprising an equalization filter coefficient processor, as described above, and an equalization filter coefficient determinator, as described above. As already mentioned, a cooperation of the equalization filter coefficient processor and of the equalization filter coefficient determinator allows for a user-friendly setting of a current set of equalization filter target coefficients, since the sets of basis equalization filter target coefficients provided by the equalization filter coefficient processor is well-suited for usage by the equalization filter coefficient determinator.

Further embodiments according to the invention provides methods for determining a current set of equalization filter target coefficients for use by an equalizer, and also methods for providing sets of basis equalization filter target coefficients.

Further embodiments according to the invention create computer programs for performing said methods.

BRIEF DESCRIPTION OF THE DRAWINGS

Embodiments of the present invention will be detailed subsequently referring to the appended drawings, in which.

DETAILED DESCRIPTION OF THE INVENTION

1. Equalization Filter Coefficient Determinator According to FIG. 1

Figure 1:
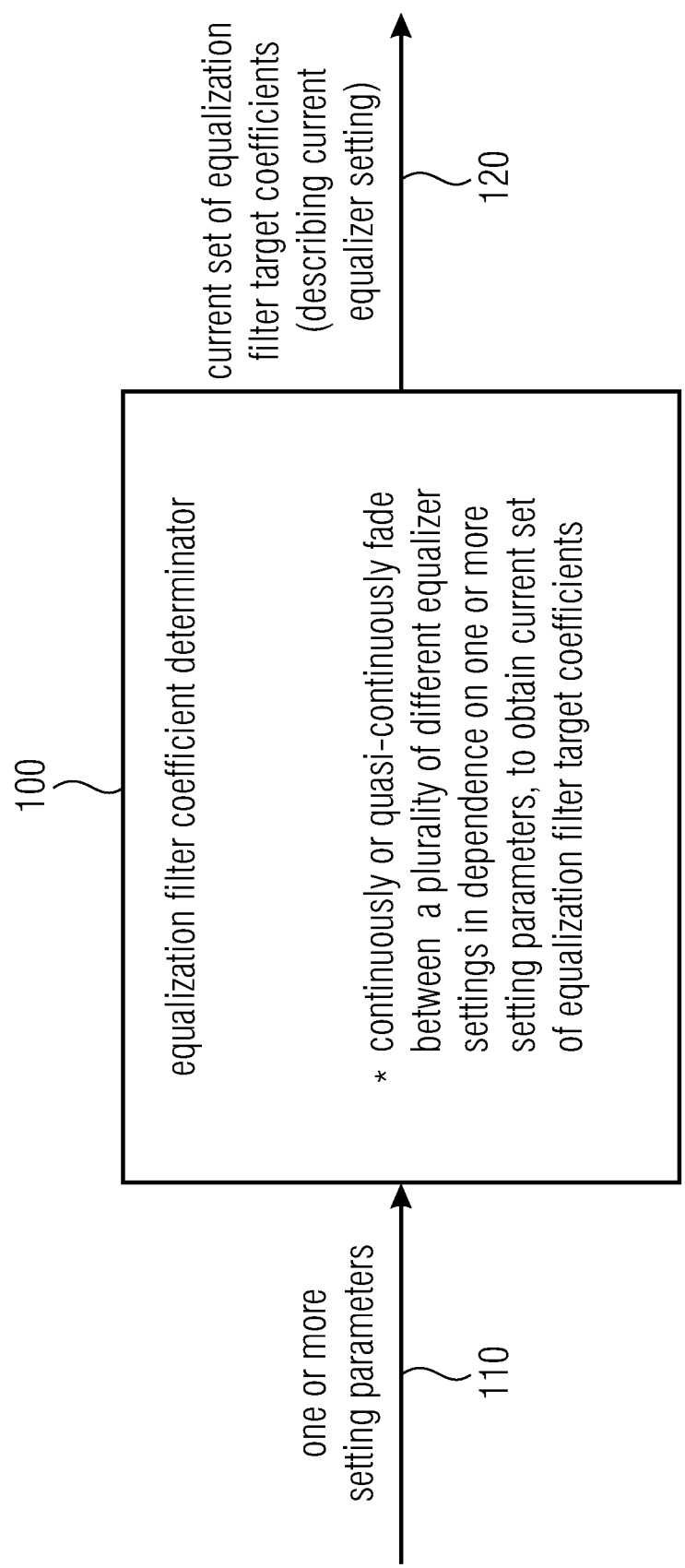
FIG. 1 shows a block diagram of an equalization filter coefficient determinator, according to an embodiment of the invention.

FIG. 1 shows a block diagram of an equalization filter coefficient determinator, according to an embodiment of the invention. The equalization filter coefficient determinator according to FIG. 1 is designated in its entirety with 100.

The equalization filter coefficient determinator 100 is configured to receive one or more setting parameters 110, for example, from a user interface. The equalization filter coefficient determinator 100 is also configured to provide a current set of equalization filter target coefficients 120, which may describe a current equalizer setting. The equalization filter coefficient determinator 100 is configured to continuously or quasi-continuously fade between a plurality of different equalizer settings in dependence on the one or more setting parameters 110, to obtain the current set 120 of equalization filter target coefficients. The number of setting parameters 110 is typically smaller than the number of equalization filter target coefficients of the current set 120 of equalization filter target coefficients.

Regarding the functionality of the equalization filter coefficient determinator, it should be noted that the one or more setting parameters 110 advantageously, but not necessarily, directly define the fading between the plurality of different equalizer settings. Thus, the one or more setting parameters may directly define, independent from the characteristics of an audio signal, how to provide the current set of equalization filter target coefficients on the basis of a previously determined fading range, wherein said fading range may, for example, be defined by previously determined (fixed) equalization filter target coefficient set components or, equivalently, sets of basis equalization filter target coefficients.

To conclude, by continuously or quasi-continuously fading between a plurality of different equalizer settings on the basis of the one or more setting parameters, a current set of equalization filter target coefficients can be provided using a simple user interface and on the basis of a signal independent linear rule.

It should be noted that the equalization filter coefficient determinator 100 can be improved by any of the features and functionalities described herein, both individually or taken in combination.

2. Equalization Filter Coefficient Determinator According to FIG. 2

Figure 2:
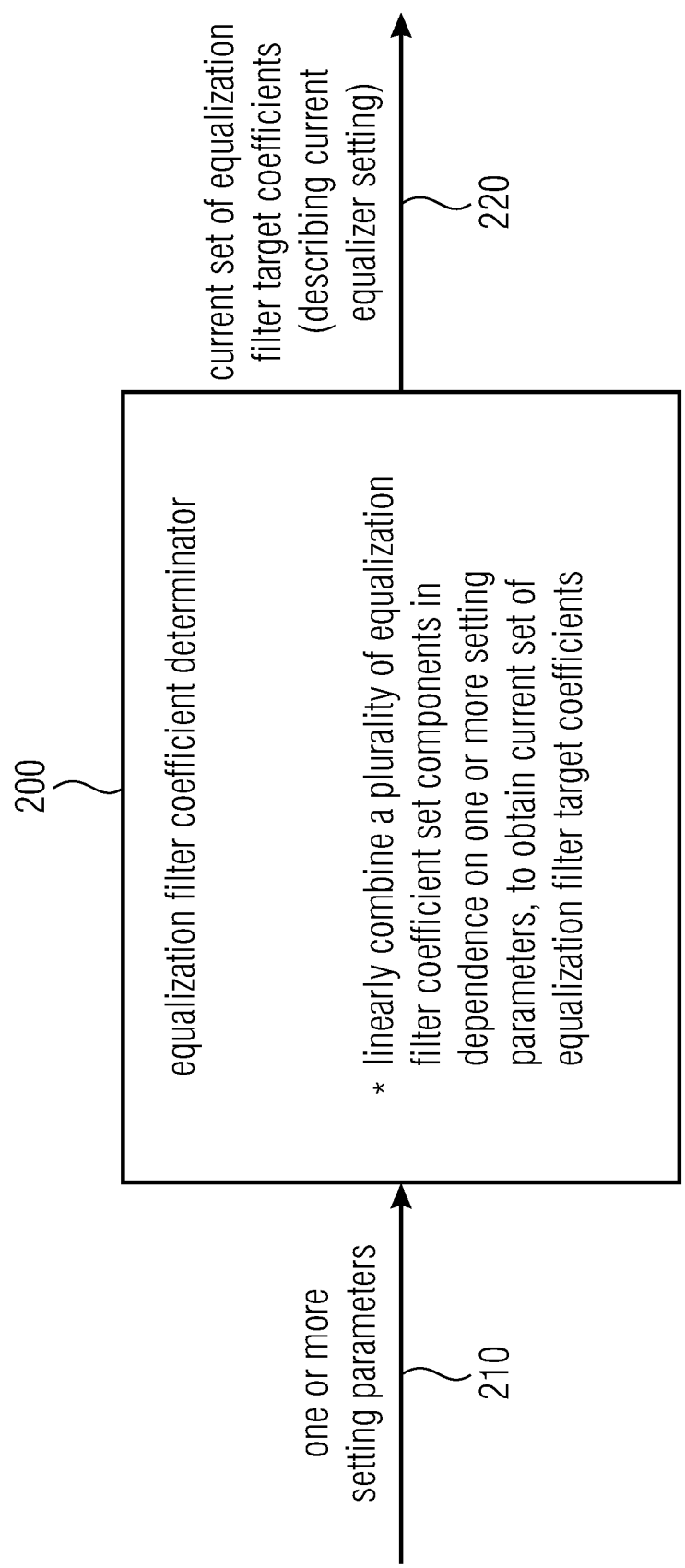
FIG. 2 shows a block diagram of another equalization filter coefficient determinator, according to another embodiment of the invention.

FIG. 2 shows a schematic diagram of an equalization filter coefficient determinator according to an embodiment of the invention.

The equalization filter coefficient determinator according to FIG. 2 is designated in its entirety with 200. The equalization filter coefficient determinator 200 is configured to receive one or more setting parameters 210, for example, from a user interface. The equalization filter coefficient determinator 200 is configured to provide a current set 220 of equalization filter target coefficients which may describe a current equalizer setting of an equalizer, wherein the equalizer may be coupled to the equalization filter coefficient determinator 200 as described below.

The equalization filter coefficient determinator 200 is configured to linearly combine a plurality of equalization filter target coefficient set components in dependence on one or more setting parameters, to obtain a current set of equalization filter target coefficients. In this case, a number of setting parameters is advantageously smaller than a number of equalization filter target coefficients of the current set of equalization filter target coefficients.

Accordingly, the equalization filter coefficient determinator 200 can obtain the current set of equalization filter target coefficients using a moderate computational effort. The equalization filter target coefficient set components may be pre-computed, such that a weighted linear combination of said pre-computed equalization filter target coefficient set components is sufficient to determine the current set of equalization filter target coefficients, wherein the weighting of the different equalization filter target coefficient set components is directly determined by the one or more setting parameters (wherein the weighting may be proportional to a value defined by the setting parameters, for example, proportional to a value defined by the user interface). Accordingly, a linear transition between two or more different equalizer settings can be obtained easily by varying the one or more setting parameters, wherein the different equalizer settings between which there is a transition are defined by the plurality of equalization filter target coefficient set components. It should be noted that the equalization filter target coefficient set components may be sets of equalization filter target coefficients between which a linear interpolation is performed. Alternatively, however, one of the equalization filter target coefficient set components may define a mean of multiple sets of reference equalization filter target coefficients, wherein another one of the equalization filter target coefficient set components may define the most characteristic deviation from said mean of the sets of reference equalization filter target coefficients, and wherein a current set of equalization filter target coefficients is obtained by a variable combination, in dependence on one or more setting parameters, of said equalization filter target coefficient set components. For example, the equalization filter target coefficient set components may be principle components of a plurality of sets of reference equalization filter target coefficients, wherein a weighting of at least some of the principle components may be determined by the one or more setting parameters 210. Alternatively, the equalization filter target coefficient set components may describe (or represent) different clusters of sets of equalization filter target coefficients associated with reference sound transducers. Alternatively, a first one of the equalization filter set components may define a "starting point" while one or more other equalization filter set components describe one or more directions of change, wherein the one or more other equalization filter set components are weighted in dependence on one or more corresponding setting parameters and added (in a weighted form) to the first one of the equalization filter set components.

To conclude, the equalization filter coefficient determinator 200 allows for a direct provision of a current set of equalization filter target coefficients in dependence on the comparatively small number of one or more setting parameters 210. The current set of equalization filter parameters may be the direct result of a linear combination of a plurality of equalization filter target coefficient set components, wherein a weighting of the different equalization filter target coefficient set components in this linear combination is determined by the one or more setting parameters (wherein the weighting may be linearly dependent from the setting parameters). Thus, a linear transition between different equalizer settings can be obtained, wherein, nevertheless, only a small amount of input information (namely, one or more setting parameters determining the linear combination) may be used.

Further, it should be noted that the equalization filter coefficient determinator may be supplemented by any of the features and functionalities disclosed herein, either alone or in combination.

3. Equalization Filter Coefficient Determinator According to FIG. 3

Figure 3:
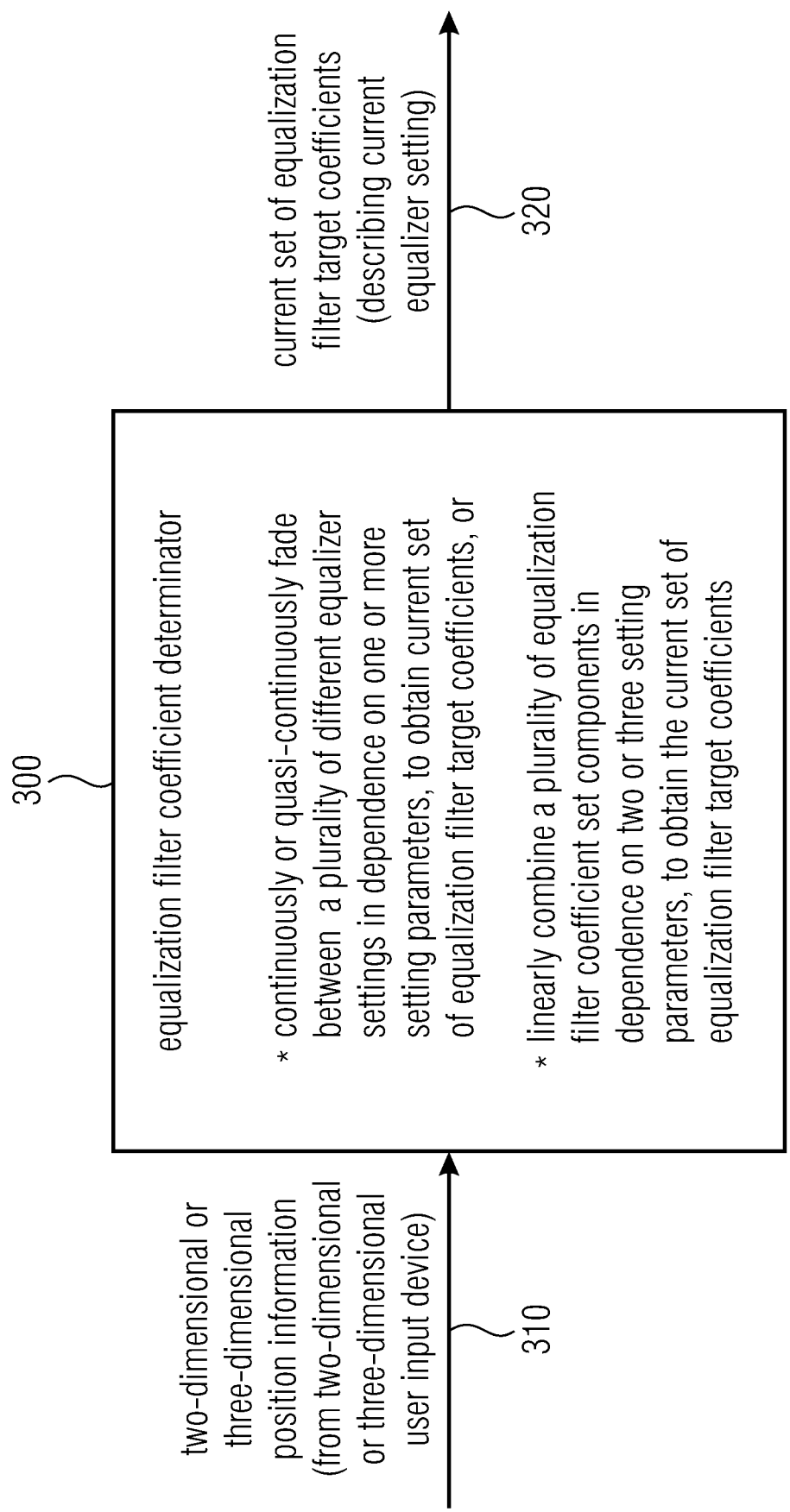
FIG. 3 shows a block diagram of another equalization filter coefficient determinator, according to another embodiment of the invention.

FIG. 3 shows a schematic diagram of an equalization filter coefficient determinator, according to an embodiment of the invention. The equalization filter coefficient determinator according to FIG. 3 is designated in its entirety with 300.

The equalization filter coefficient determinator 300 is configured to obtain (or receive) a two-dimensional or three-dimensional position information 310, for example, from a two-dimensional user input device or from a three-dimensional user input device. The equalization filter coefficient determinator 300 is configured to provide a current set 320 of equalization filter target coefficients which may describe a current equalizer setting. The equalization filter coefficient determinator 300 is configured to obtain the current set 320 of equalization filter target coefficients in dependence on the two-dimensional position information 310 or the 3-dimensional position information 310 obtained using a two-dimensional or three-dimensional user input device. For this purpose, the equalization filter coefficient determinator is configured to continuously or quasi-continuously fade between a plurality of different equalizer settings in dependence on two or three setting parameters derived from, or determined by, the two-dimensional or three-dimensional position information 310. The two or three setting parameters may directly determine the fading position between the different equalizer settings, such that the current set of equalization parameters is obtained by the continuous or quasi-continuous fading (wherein a fading position may be linearly dependent from the two or three setting parameters). Alternatively, the equalization filter coefficient determinator 300 is configured to linearly combine a plurality of equalization filter target coefficient set components (as described above) in dependence on two or three setting parameters derived from, or defined by, the two-dimensional or three-dimensional position information. Accordingly, the current set of equalization filter target coefficients may be obtained by this linear combination. For example, the weighting coefficients may be linearly dependent from the setting parameters (or even linearly dependent from the position), or may be identical to the setting parameters.

Accordingly, the equalization filter coefficient determinator 300 is configured to provide the current set of equalization parameters on the basis of a very intuitive control information, namely a two-dimensional or three-dimensional position information obtained from a two-dimensional user input device or a three-dimensional user input device. Thus, it is possible even for an inexperienced user to intuitively adjust and tune the current equalizer setting described by the current set of equalization filter target coefficients. A change of the position defined by the two-dimensional user input device or the three-dimensional user input device results in a fading between different equalizer settings. Also, a change of the position defined by the two-dimensional or three-dimensional user input device may result in a change (for example, in a proportional change) of the linear combination of a plurality of equalization filter target coefficients, such that the user may perceive a change of the equalizer setting in response to a change of the position defined using the two-dimensional or three-dimensional user input device. Accordingly, the user may intuitively identify a position defined using the two-dimensional or three-dimensional user input device which results in a reasonably good equalization result.

To conclude, the equalization filter coefficient determinator 300 provides for an intuitive solution to adjust an equalizer setting, wherein the determination of the current set of equalization filter target coefficients on the basis of the two-dimensional or three-dimensional position information 310 involves little computational effort.

4. Apparatus According to FIG. 4

Figure 4:
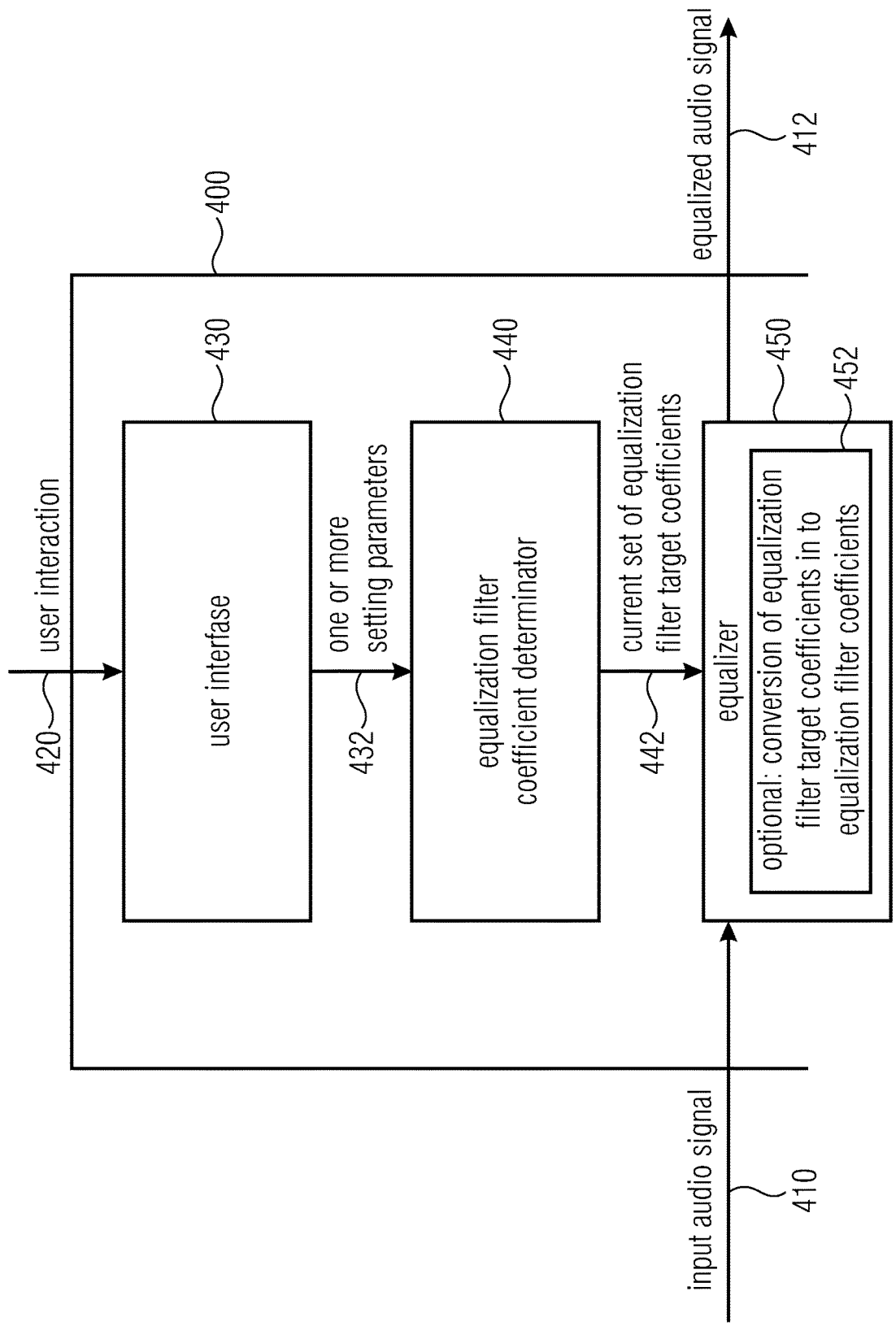
FIG. 4 shows a block schematic diagram of an apparatus, according to an embodiment of the invention.

FIG. 4 shows a block schematic diagram of an apparatus according to an embodiment of the present invention.

The apparatus according to FIG. 4 is designated in its entirety with 400.

The apparatus 400 is configured to receive an input audio signal 410 and to provide, on the basis thereof, an equalized audio signal 412. The apparatus 400 is also configured to receive a user interaction 420, which determines (or defines) an equalizer setting for the derivation of the equalized audio signal 412 from the input audio signal 410.

The apparatus 400 comprises a user interface 430, wherein the user interface is configured to obtain one or more setting parameters 432 in response to the user interaction 420. The apparatus 400 also comprises an equalization filter coefficient determinator 440 which is configured to receive the one or more setting parameters 432 from the user interface. It should be noted that the equalization filter coefficient determinator 440 may be identical to the equalization filter coefficient determinator 100 according to FIG. 1, the equalization filter coefficient determinator 200 according to FIG. 2, or the equalization filter coefficient determinator 300 according to FIG. 3. The equalization filter coefficient determinator 440 is configured to provide a current set 442 of equalization filter target coefficients on the basis of the one or more setting parameters 432. The apparatus 400 also comprises an equalizer 450 which is configured to receive the current set 442 of equalization filter target coefficients from the equalization filter coefficient determinator 440 and to equalize the input audio signal 410 on the basis of the received current set 442 of equalization filter target coefficients, to obtain the equalized audio signal 412. Accordingly, the input audio signal, which is intended to be output by a sound transducer, is equalized by the equalizer 450, which uses the current set 442 of equalization filter target coefficients, to thereby obtain the equalized audio signal 412. The equalization performed by the equalizer 450 may, for example, serve the purpose to compensate for imperfections of the frequency response of a sound transducer (for example, headphone) which outputs the equalized audio signal.

For example, the equalizer may be configured to perform the equalization in the frequency domain. In this case, the equalization filter target coefficients, which may directly represent amplitudes of a target equalization filter response for a plurality of different frequencies, may be applied, for example as gain factors or weighting coefficients, to the frequency domain coefficients representing the audio signal. For example, each of the equalization filter target coefficients may determine a gain or a weighting of one or more frequency domain component representing the audio signal.

Alternatively, the equalizer may be configured to perform an equalization in the time domain, i.e., perform a finite impulse response filtering of the input audio signal in the time domain or may perform an infinite impulse response filtering of the input audio signal in the time domain. In this case, the equalizer may optionally (confer, for example, reference numeral 452) derive e.g. by filter design coefficients for the finite impulse response filter or coefficients for the infinite impulse response filter from the current set of equalization filter target coefficients, if the equalization filter target coefficients represent the target equalization filter response in the frequency domain, i.e., represent amplitudes of a target equalization filter response for a plurality of different frequencies. However, if the equalization filter target coefficients are time domain filter coefficients (i.e., coefficients of a finite impulse response filter or of an infinite impulse response filter), the equalizer may directly use the equalization filter target coefficients as coefficients of a time domain filter.

Accordingly, the apparatus 400 provides a simple solution to define an equalization of the input audio signal 410 on the basis of the user interaction 420. The equalization filter coefficient determinator 440 is typically configured to provide the current set 442 of equalization filter target coefficients in dependence on the one or more setting parameters 432, such that the current set of equalization filter target coefficients 442 is well-adapted to different types of sound transducers in dependence on the one or more setting parameters. In other words, the equalization filter coefficient determinator maps a comparatively small number of one or more setting parameters 442, which are defined by the user interaction 420, onto corresponding sets 442 of equalization filter target coefficients, wherein the equalization filter coefficient determinator 440 evaluates a typically linear rule to map the one or more setting parameters 432 onto the current set 442 of equalization filter target coefficients. Accordingly, the complexity of the equalization filter coefficient determinator 440 is typically very moderate. Also, it should be noted that a change of a single setting parameter, which can easily be achieved via the user interaction 420, typically varies a large number of equalization filter target coefficients of the current set 442 of equalization filter target coefficients, such that it is possible to efficiently, and typically smoothly, transition between different sets of equalization filter target coefficients.

Advantageously, the apparatus allows for an instantaneous feedback, such that a delay between a user interaction 420 and a change of the current set 442 of equalization filter parameters is typically smaller than 100 ms. Accordingly, the user can immediately get acoustic feedback how the change of the current set 442 of equalization filter target coefficients effected by his user interaction 420 affects the hearing impression of the equalized audio signal 412, which is typically played back using a sound transducer. Accordingly, the user can control the current set 442 of equalization filter target coefficients via a user input (user interaction) 420, such that a hearing impression of the equalized audio signal 412, rendered by a particular currently used sound transducer, satisfies his expectations.

To summarize, the apparatus 420 allows to compensate for imperfections of a sound-transducer's frequency response, wherein a simple user interface 430, which may, for example, comprise a single slider or a single knob or a possibility for a two-dimensional input or a possibility for a three-dimensional input, may be used to adjust the current set 442 of equalization filter target coefficients used for an equalization of an input audio signal, to obtain the equalized audio signal 412 to be output by the currently used sound transducer. By using an equalization filter coefficient determinator, as described above, the computational complexity can be kept small while still allowing the user to select an appropriate equalization and to even fine-tune the equalization.

5. Equalization Filter Coefficient Processor According to FIG. 5

Figure 5:
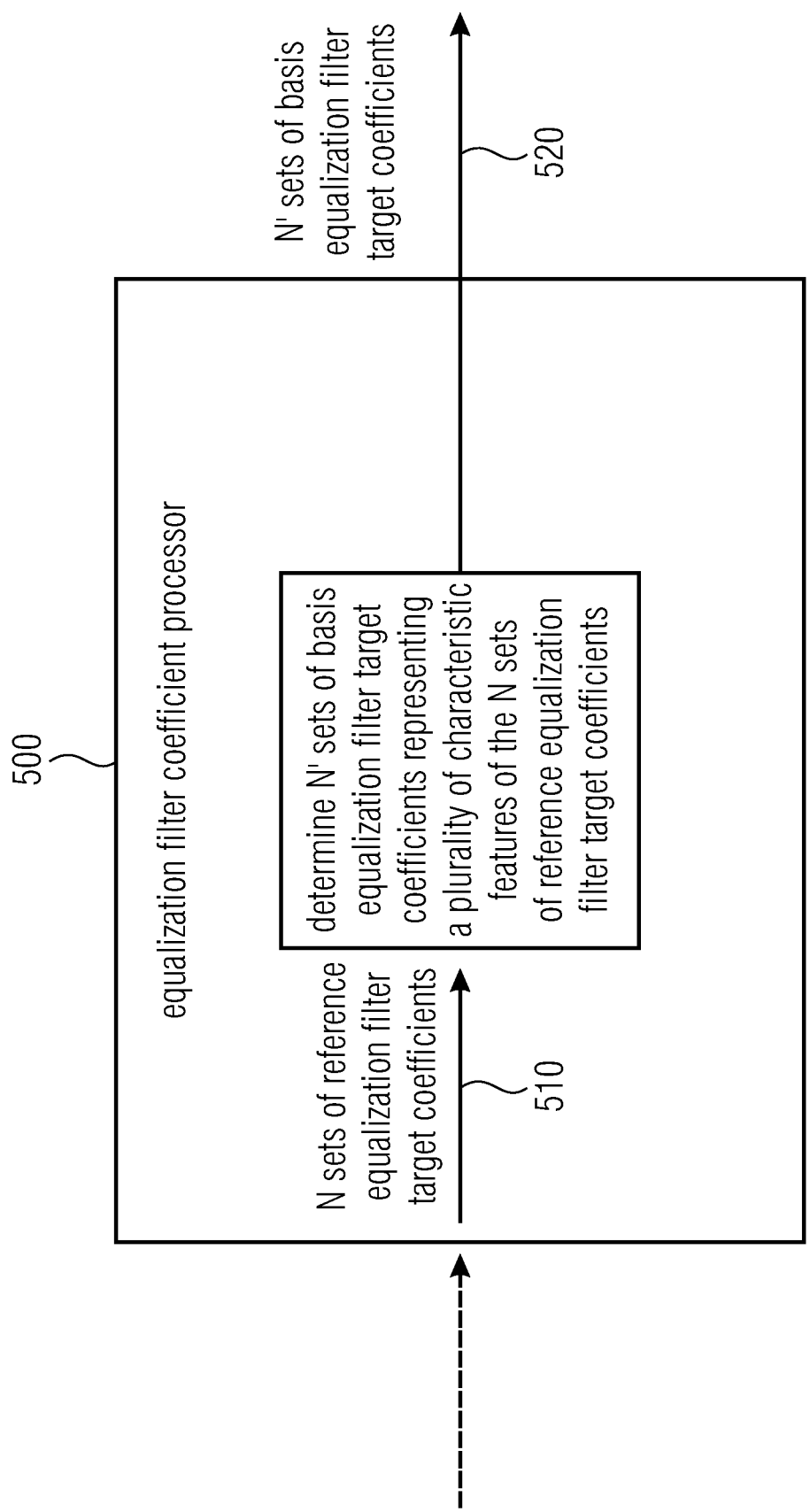
FIG. 5 shows a block diagram of an equalization filter coefficient processor, according to an embodiment of the invention.

FIG. 5 shows a schematic diagram of an equalization filter coefficient processor 500 according to an embodiment of the invention. The equalization filter coefficient processor 500 is designated in its entirety with 500.

The equalization filter coefficient processor is configured to obtain (for example, receive or generate) N sets 510 of reference equalization filter target coefficients. Moreover, the equalization filter coefficient processor 500 is configured to determine and provide N' sets 520 of basis equalization filter target coefficients representing (or reflecting, or describing) a plurality of characteristic features of the N sets 510 of reference equalization filter target coefficients. The equalization filter coefficient processor 500 is configured to provide the N' sets of basis equalization filter target coefficients to an equalization filter coefficient determinator (for example, as explained above) for the derivation of a current set of equalization filter target coefficients. Advantageously, a number N' of sets 520 of basis equalization filter target coefficients is larger than or equal to two, while a number of N sets 510 of reference equalization filter target coefficients is larger than the number N' of sets 520 of basis equalization filter target coefficients.

In other words, the equalization filter coefficient processor 500 is configured to provide a reduced number of sets 520 of basis equalization filter target coefficients on the basis of a larger number of sets 510 of reference equalization filter target coefficients, wherein the equalization filter coefficient processor 500 is configured to provide the sets 520 of basis equalization filter target coefficients such that the sets 520 of basis equalization filter target coefficients represent, at least approximately, some of the most characteristic features of the sets 510 of reference equalization filter target coefficients. Thus, the sets 520 of basis equalization filter target coefficients are provided such that they can be used to approximate the sets 510 of reference equalization filter target coefficients. Worded yet differently, the sets 520 of basis equalization filter target coefficients are provided such that a combination of the sets 520 of basis equalization filter target coefficients yields, as a result of the combination and in dependence on a weighting, different sets of equalization parameters which have, at least approximately, some characteristic features in common with one or more of the sets 510 of reference equalization filter parameters.

For example, the equalization filter coefficient processor 500 may be configured to perform a principle component analysis on the basis of the N sets 510 of reference equalization filter target coefficients, to obtain the N' sets 520 of basis equalization filter target coefficients. The N' sets of basis equalization filter target coefficients may, in this case, represent (or be equal to) principle components of the N sets 510 of reference equalization filter target coefficients.

In an alternative embodiment, the equalization filter coefficient processor may be configured to perform a cluster analysis on the basis of the N sets 510 of reference equalization filter target coefficients, to identify a plurality of clusters into which the N sets 510 of reference equalization filter target coefficients can be grouped. Accordingly, the N' sets 520 of basis equalization filter target coefficients are provided, in this case, such that the N' sets 520 of basis equalization filter target coefficients are associated with the N' clusters. For example, the N' sets of basis equalization filter target coefficients may describe, or represent, N' clusters. For example, each of the N' sets of basis equalization filter target coefficients may be associated with one cluster and represent, for example, a center of a cluster of a plurality of sets 510 of reference equalization filter target coefficients, or a mean of a plurality of sets 510 of a reference equalization filter target coefficients associated with the respective cluster.

Moreover, it should be noted that the equalization filter coefficient processor 500 may receive the N sets 510 of reference equalization filter target coefficients from an external unit, or may derive the N sets 510 of reference equalization filter target coefficients from measured reference transfer characteristics for a plurality of reference sound transducers using one or more target transfer characteristics. For example, the equalization filter coefficient processor 500 may determine the sets 510 of reference equalization filter target coefficients such that the sets 510 of reference equalization filter target coefficients define equalizer settings to compensate a deviation of measured reference transfer characteristics of a plurality of reference sound transducers from the one or more target transfer functions. In other words, each set 510 of reference equalization filter target coefficients may define an equalizer setting which achieves that the transfer function of the respective reference sound transducer is equalized to follow a respective target transfer characteristic.

To further conclude, the equalization filter coefficient processor 500 provides a comparatively small number of sets 520 of basis equalization filter target coefficients which nevertheless carry the most important information of a comparatively larger number of sets 510 of reference equalization filter target coefficients. Accordingly, the sets 520 of basis equalization filter target coefficients form a good basis for efficiently deriving a current set of equalization filter target coefficients using the equalization filter coefficient determinator as described herein.

6. System According to FIG. 6

Figure 6:
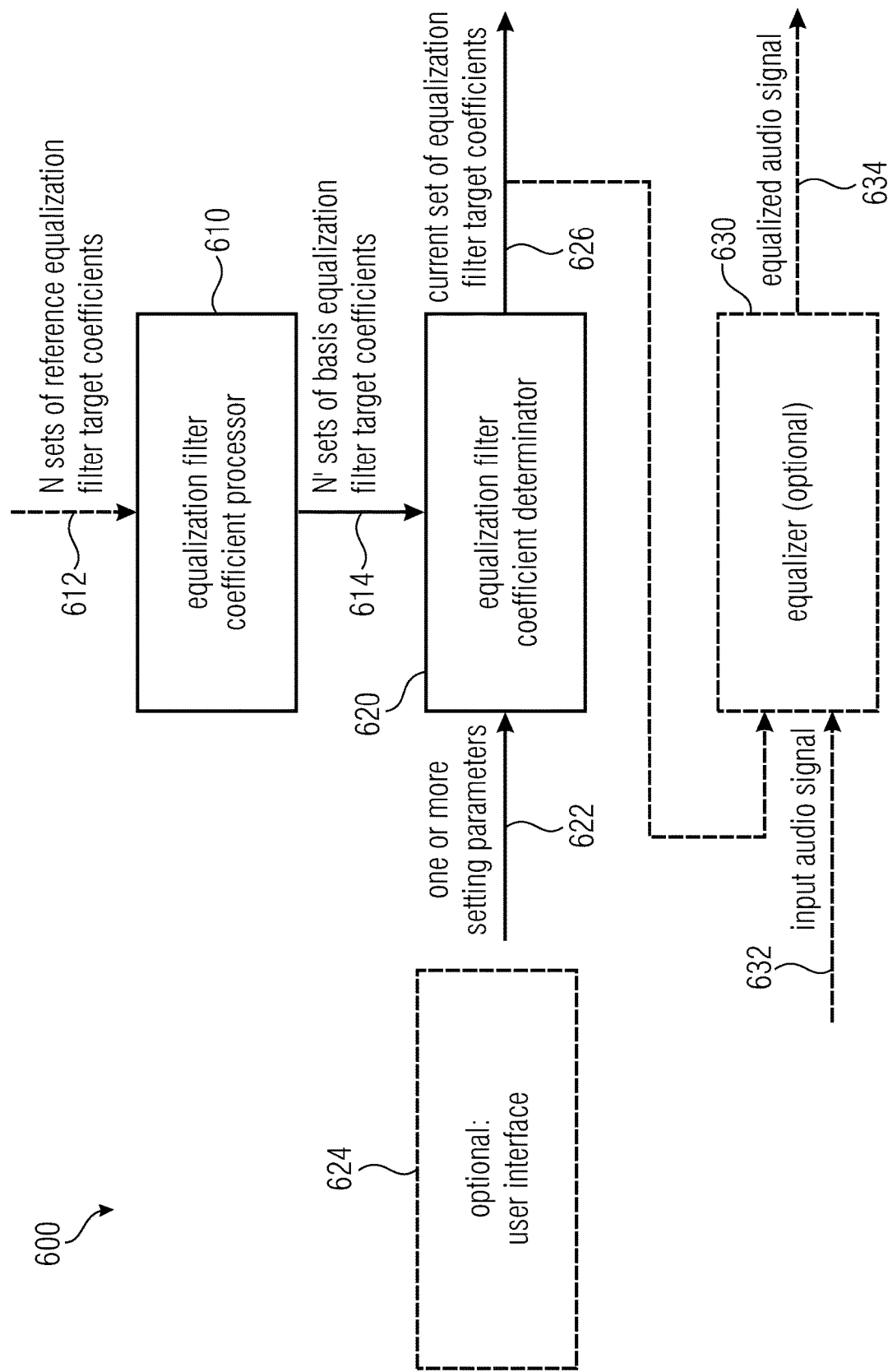
FIG. 6 shows a block schematic diagram of a system, according to an embodiment of the present invention.

FIG. 6 shows a block schematic diagram of a system, according to an embodiment of the present invention. The system is designated in its entirety with 600.

The system 600 comprises an equalization filter coefficient processor 610 which is configured to receive or generate N sets 612 of reference equalization filter target coefficients. The equalization filter coefficient processor 610 is configured to provide, on the basis thereof, N' sets 614 of basis equalization filter target coefficients. It should be noted that the equalization filter coefficient processor 610 may be equivalent to the equalization filter coefficient processor 500, and that the set 612 of reference equalization filter target coefficients may be equivalent to the set 510 of reference equalization filter target coefficients. Also, the set 614 of basis equalization filter target coefficients may be equivalent to the set 520 of basis equalization filter target coefficients.

The system 600 also comprises an equalization filter coefficient determinator 620 which is configured to receive the N' sets 614 of basis equalization filter target coefficients. Also, the equalization filter coefficient determinator 620 is configured to receive one or more setting parameters 622 from a user interface 624, which may optionally also be part of the system 600. The equalization filter coefficient determinator 620 is configured to provide, on the basis of the one or more setting parameters 622, and also on the basis of the N' sets 614 of basis equalization filter target coefficients, a current set 626 of equalization filter target coefficients. It should be noted that the equalization filter coefficient determinator 620 may equivalent to the equalization filter coefficient determinators 100, 200, 300, 440 described herein. Moreover, it should be noted that the set 614 of basis equalization filter target coefficients may define a plurality of different equalizer settings, and/or may take the role of the equalization filter target coefficient set components.

The system 600 optionally comprises an equalizer 630, which is configured to receive the current set 626 of equalization filter target coefficients. Also, the optional equalizer 630 typically receives an input audio signal 632 and provides, on the basis thereof, an equalized audio signal 634, wherein the equalization functionality of the equalizer 630 is performed in dependence on the current set 626 of equalization filter target coefficients. In other words, the current set 626 of equalization filter target coefficients may define the filter function applied by the equalizer 630 to the input audio signal 632, to obtain the equalized audio signal 634.

The system 600 allows to easily adjust the equalizer 630 to compensate for imperfections of a currently used sound transducer. A comparatively small number of N' sets of basis equalization filter target coefficients are provided by the equalization filter coefficient processor 610 on the basis of the comparatively larger number of N sets of reference equalization filter target coefficients. The equalization filter coefficient determinator 620 can determine the current set 626 of equalization filter target coefficients using a relatively simple and user friendly user interface, wherein a computational effort for deriving the current set 626 of equalization filter target coefficients from the set 614 of basis equalization filter target coefficients may be small. Also, a small number of setting parameters which can be varied by the user may be sufficient because the sets 614 of basis equalization filter target coefficients comprise the most relevant information about the actual sets of reference equalization filter target coefficients.

Accordingly, the system, which may be operated in a distributed manner (wherein, for example, the sets 614 of basis equalization filter target coefficients are provided by a server to a user device which comprises the equalization filter coefficient determinator 620 and the equalizer 630), facilitates the adaptation of an equalizer setting to a currently used sound transducer (for example, to a currently used headphone) and therefore improves a customer satisfaction. Only the computationally simple equalization filter coefficient determinator 620 and the equalizer 630 should be implemented in the end user device, which allows for a cheap and power efficient implementation.

7. Implementation Example According to FIGS. 7 and 8

In the following, another implementation example according to an embodiment will be described. However, the teachings disclosed in this section can be used in combination with any of the embodiments described herein.

An embodiment according to the invention is based on performing a principle component analysis (PCA analysis) on sound transducer filter data (for example, headphone filter data). This embodiment according to the present invention makes it possible to conveniently match a perceptively correct filter (or at least a filter which provides a reasonably good sound quality) to a headphone (or an other sound transducer), regardless of if it has been previously measured or not. This is made possible by extracting the most significant features of a pool of filters (corresponding to different headphone models) and enabling the user to control these features. An example for 13 filters is given in FIG. 7, which shows an example for a pool of 13 headphone specific filters derived from dummy-head measurements.

Figure 7:
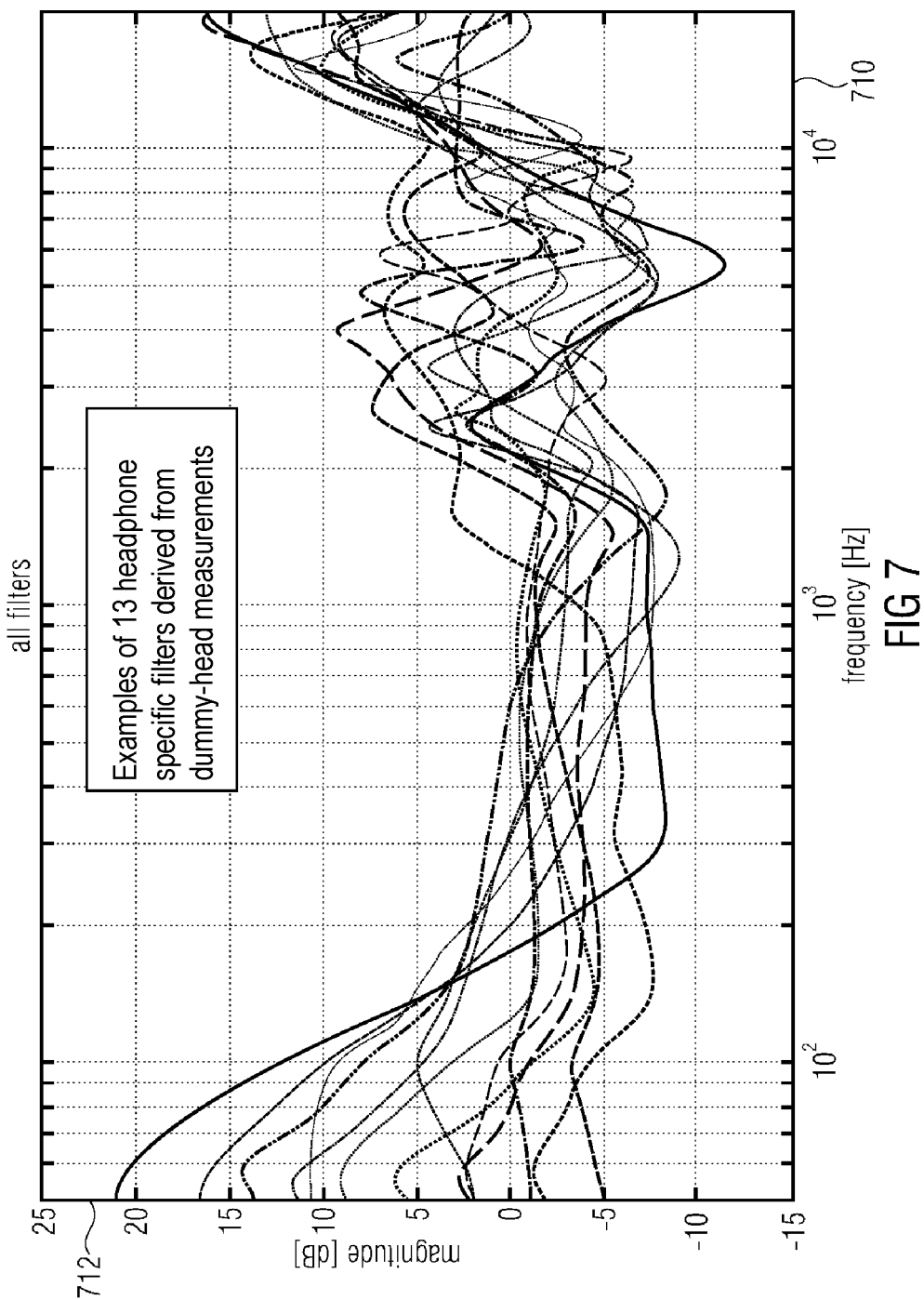
FIG. 7 shows a graphic representation of an example for a pool of 13 headphone specific filters derived from dummy-head measurements.

Taking reference now to FIG. 7, it should be noted that an abscissa 710 describes a frequency in the unit of Hertz, wherein a logarithmic scaling is used. An ordinate 712 describes a magnitude (or relative magnitude) in the unit of Decibels. 13 different curves describe a filter characteristic over frequency. In other words, the curves of FIG. 7 represent filter characteristics of equalization filters which can be used to compensate for the non-ideal transfer characteristics of the reference headphones (reference sound transducers). In other words, the curves of FIG. 7 represent equalizer settings which result in an overall transfer function of the equalizer and the headphone such that the overall transfer function approximates (or is equal to) a target transfer characteristic.

It should be noted that the equalization filter-curves shown in FIG. 7 comprise comparatively strong variations over frequency. Accordingly, the equalization filter-curves according to FIG. 7 should advantageously—but not necessarily—be represented by a comparatively large number of equalization filter target coefficients in a digital signal processing system in order to properly reflect the variations over frequency. It should also be noted that the equalization filter-curves shown in FIG. 7 may be represented by the reference equalization filter target coefficients mentioned in the description. Also, it should be noted that sets of reference equalization filter target coefficients representing the equalization filter-curves of FIG. 7 may be used by the equalization filter coefficient processor described herein.

It has been found that, by applying a principle component analysis (PCA) (for details, reference is made, for example, to reference [6]), a number of filter-curves (or, equivalently, the number of sets of equalization filter target coefficients) can be significantly reduced without losing much information. The filter-curves, each specific for one headphone, are thereby transformed to generic filter-curves and headphone-specific weights (wherein, however, it is not necessary in some embodiments according to the invention to determine said headphone-specific weights).

With M being the resolution of points of the frequency axis for each of the filter-curves (for example, M=1024) and N being the number of filter-curves (for example, N=13), a matrix with dimensions M×N can be created. It should be noted that M=1024 and N=13 are examples, wherein any positive and integer numbers can be assigned to M and N.

In other words, the N=13 equalization filter-curves may represented by N=13 sets of reference equalization filter target coefficients, wherein each of the sets of the reference equalization filter target coefficients may comprise M=1024 filter coefficients. Accordingly, a matrix with dimensions M×N can be created comprising N=13 columns of M=1024 equalization filter target coefficients each.

This functionality may, for example, be performed by the equalization filter coefficient processor described herein.

In a further processing, a number of dimensions, for example, of said matrix, may be reduced. For example, a number of dimensions may be reduced from N=13 down to N=2 (wherein it should be noted that the reduced number of dimensions is also designated herein with N').

In other words, by applying the principle component analysis, the dimensions (or number of dimensions) N can be reduced from 13 down to, for example, 2. However, the resolution M=1024 on the frequency axis advantageously stays the same.

These, for example, two vectors ($\vec{p}_0$, $\vec{p}_1$) are called principle components.

Using, for example, two principle components (also designated as "PCs", for example, principle components $\vec{p}_0$, $\vec{p}_1$), there is one degree of freedom adjusting the curves with a weight W:

$$\vec{f} = \vec{p}_0 + W \cdot \vec{p}_1$$

In the above, $\vec{f}$ is a vector, the elements (or entries) of which are equalization filter target coefficients. In other words, the vector $\vec{f}$ represents a current set of equalization filter target coefficients. $\vec{p}_0$ represents, for example, a mean of all sets of reference equalization filter target coefficients. For example, $\vec{p}_0$ represents a mean of a plurality of vectors, the elements of which represent (sets of) equalization filter target coefficients of different reference equalization filters (associated with different reference sound transducers). $p_1$ represents a first principle component of the N sets of a reference equalization filter target coefficients.

However, it should be noted that, in the literature, different notations are sometimes used, such that $\vec{p}_0$ would be designated as a "first principle component" in some literature, and that $\vec{p}_1$ would be designated as a second principle component in some literature.

However, $\vec{f}$ equals to the sum of the mean of all filter-curves ($\vec{p}_0$) and the weighted first principle component (PC) ($W \cdot \vec{p}_1$). W is a weighting coefficient, and may be equivalent to a setting parameter as described above. For example, W may be (directly) proportional to a setting of a slider or a knob.

Instead of storing each of the 13 unique filter-curves (or, equivalently, 13 sets of reference equalization filter target coefficients), the two generic curves (vectors $\vec{p}_0$, $\vec{p}_1$) and 13 unique scalar weights may be stored. However, it should be noted that, in embodiments according to the present invention, it is not necessary to store 13 unique scalar weights W (or any scalar weights).

Nevertheless, it should be noted that, by performing an addition and multiplication using the one of the 13 unique weights W in the formula $\vec{f} = \vec{p}_0 + W \cdot \vec{p}_1$, a resulting curve (or set of equalization filter target coefficients) $\vec{f}$ provides the best fit (or at least a sufficiently good fit) to restore the original curve.

In other words, the formula $\vec{f} = \vec{p}_0 + W \cdot \vec{p}_1$ can be used to efficiently reconstruct sets of equalization filter target coefficients (described by the vector $\vec{f}$) which approximate the N sets of reference equalization filter target coefficients provided that the principle components $\vec{p}_0$ and $\vec{p}_1$ and 13 different values for the weighting parameter W are stored, wherein the 13 different values for the weighting parameters W are associated with different ones of the sets of reference equalization filter target coefficients.

However, in some embodiments according to the invention, it may be sufficient to derive two (or, optionally, more) principle components $\vec{p}_0$, $\vec{p}_1$ from a plurality of, for example, N sets of reference equalization filter target coefficients. This task may be performed, for example, by the equalization filter coefficient processor, which may provide the N' principle components $\vec{p}_0$, $\vec{p}_1$ as sets of basis equalization filter target coefficients for usage by an equalization filter coefficient determinator.

In the following, an implementation and user interface will be described which can be used, for example, for determining a current set of equalization filter target coefficients.

For example, in a user's device, the one or more weights W may need to be chosen by the user (for example, using user interface). In case of one weight (as described in the above example for reducing the number of dimensions from N=13 down to N'=2), an adequate user interface could be a slider or a tuning knob (wherein the position of the slider or tuning knob may, for example, define the weight W). For two weights (for example, in the case that three principle components $\vec{p}_0$, $\vec{p}_1$ and $\vec{p}_2$ are extracted and linearly combined), an area like a screen of a Smartphone may be used (providing two axes [x, y] and thereby the possibility to adjust two weights).

The weights, representing a frequency response, are most easily applied on a signal in a frequency-domain by applying a gain per frequency band. For a time-domain signal, they may need to be converted to a corresponding filter (for example, a time-domain filter).

In other words, an equalization filter coefficient determinator, which may be part of a user device, may obtain (for example, download from an external database fed by an equalization filter coefficient processor, or take from an internal database) the principle components, and may, for example, obtain the vector $\vec{f}$ (representing a set of current equalization filter target coefficients) according to the equation $\vec{f} = \vec{p}_0 + W \cdot \vec{p}_1$. The weight W may be set in accordance with a setting parameter received for a user interface or may even be equal to the setting parameter received from the user interface. Accordingly, the equalization filter coefficient determinator can obtain the current set of equalization filter target coefficients using a simple weighted combination of the two principle components. If more than two principle components are used, additional weights (derived from additional setting parameters or equal to additional setting parameters) may be applied in this linear combination.

In the following, a usage example will be described. For example, after plugging in a new headphone to a playback device (for example, an end user device comprising the equalization filter coefficient determinator), a playback of sound material may be started. The user may then activate the headphone equalization and may change the one or more weights W while listening to the music, and may thereby find the perceptive optimal tuning for the attached headphone.

Figure 8:
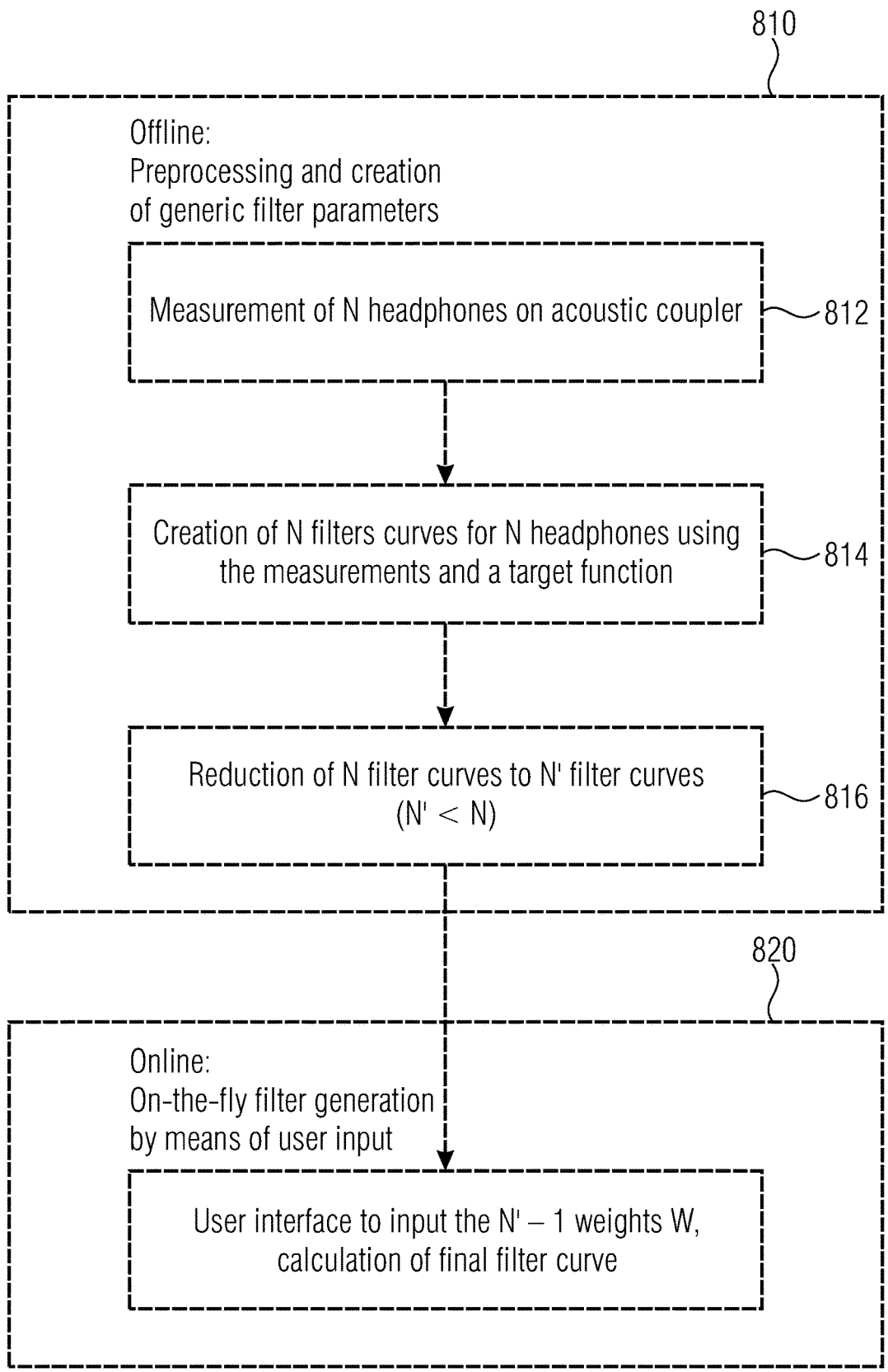
FIG. 8 shows a summary of the needed processing steps to create a final filter curve.
Figure 9:
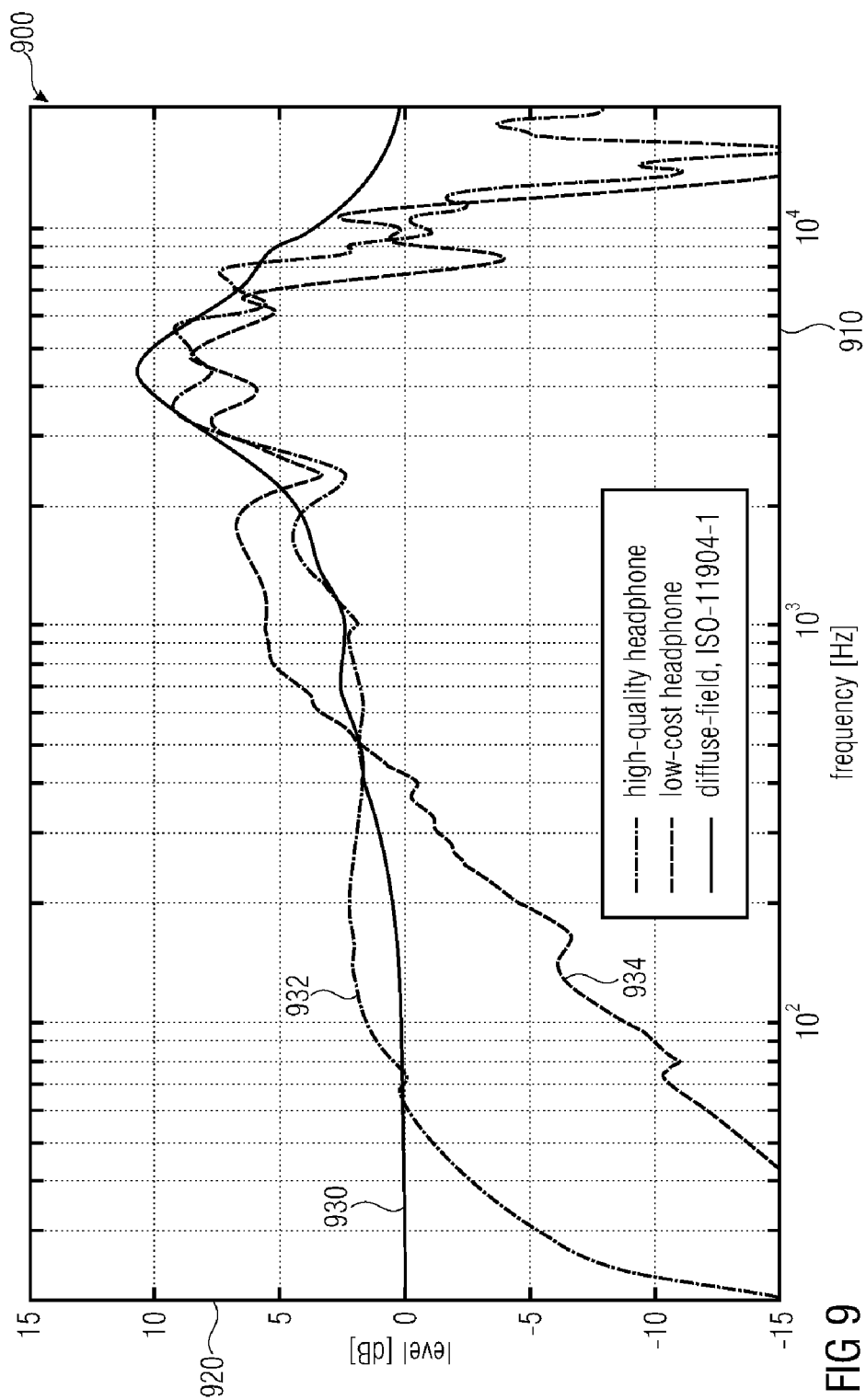
FIG. 9 shows a graphic representation of frequency responses of different headphones.
Figure 10A:
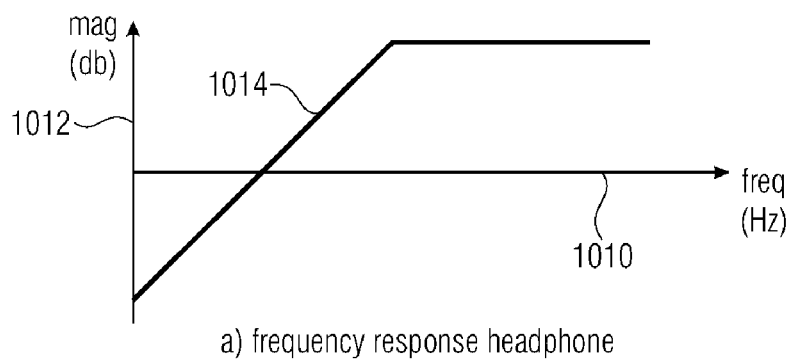
FIGS. 10A-10C show a graphic representation of a scheme for a generation of discrete filters for specific headphones.
Figure 10B:
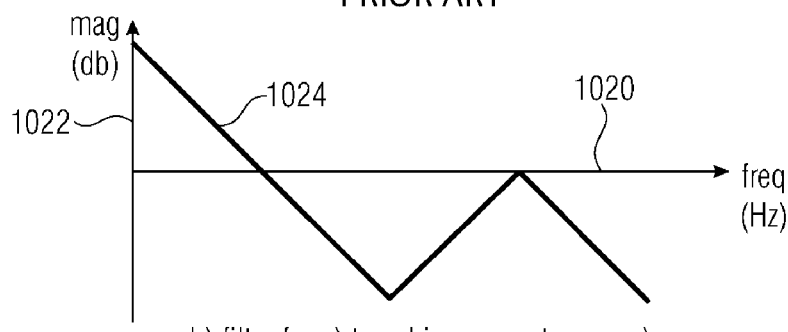
Figure 10C:
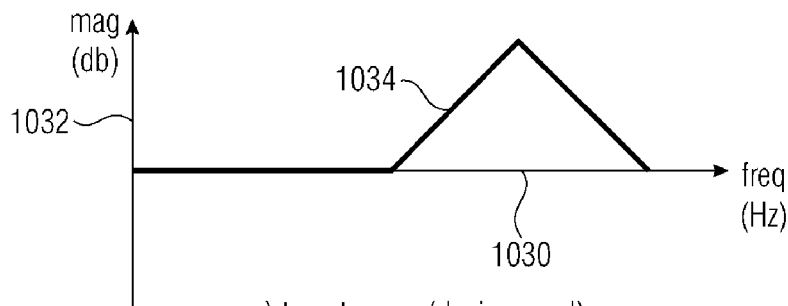

In the following, a possible implementation of the concept according to the present invention will be summarized taking reference to the flow chart of FIG. 8, which shows the summary of processing steps to create a final filter-curve.

In a step 810, which may be performed offline (for example, by the equalization filter coefficient processor), a preprocessing and creation of generic filter parameters is performed. In a step 820, which may be performed "online" (for example, by the equalization filter coefficient determinator), an on-the-fly filter generation by means of user input is performed.

The step 810 of preprocessing and creating generic filter parameters comprises performing 812 a measurement of N headphones (or other sound transducers) on an acoustic coupler.

The step 810 also comprises a creation 814 of N filters curves for N headphones (or other sound transducers) using the measurements (for example, the measurements performed in step 812) and a target function. Accordingly, reference equalization filter-curves or sets of reference equalization filter target coefficients may be generated in step 814.

Step 810 also comprises a reduction 816 of N filter-curves (for example, of the filter-curves created in step 814) to N' filter-curves, wherein N' is typically smaller than N (with N' and N being integers). Accordingly, equalization filter target coefficient set components (for example, principle components or sets of equalization filter target coefficients representing a plurality of clusters) may be obtained in step 816.

Step 820, which may be performed by an end user device (for example, a mobile phone, or any other apparatus outputting an audio signal via a sound transducer) will be performed "online" or "on-the-fly", for example, during a playback of an audio signal.

Step 820 may comprise the usage of an user interface to input the N'-1 weights W (which may be considered as setting parameters). Step 820 also comprises a calculation of a final filter curve on the basis of the N' filter curves provided in step 816 and in dependence on the N'-1 weights W input using the user interface in step 820. Accordingly, a final filter curve is obtained, which may, for example, be represented by a current set of equalization filter target coefficients.

In the step 820, the functionality described above with respect to the equalization filter coefficient determinator may be implemented.

8. Conclusions

To summarize the above, embodiments according to the invention create a "look-and-feel" which allows to steplessly modify a target curve in a frequency domain using one slider or a small number of sliders or one control dial (or knob) or a small number of control dials (or knobs) or a two dimensional area like a screen of a mobile device (or the like). The (filter-)settings should, advantageously but not necessarily, be made audible directly when changing the control element (slider, and so on).

Moreover, embodiments according to the invention are based on the idea that steplessly variable filters compensate or reduce the imperfections of electro acoustic transducers, wherein control and/ore monitoring is performed directly by the user via his sense of hearing.

In some embodiments according to the invention, a principle component analysis is implemented. However, in alternative implementations, each possibility to extract the most important characteristics (or features) and/or to reduce a number of filter-curves can be used in principle. For example, a cluster analysis may be used which separates a pool of curves (for example, reference equalization filter curves or sets of reference equalization filter target coefficients) into multiple clusters within which, again, curves which are as similar as possible are integrated (or concentrated, or combined). Accordingly, it is possible to steplessly cross-fade between these curves (or sets of reference equalization filter target coefficients).

Moreover, it should be noted that there are different possibilities for the user to control the features. In one implementation (which uses the principle component analysis), the user controls the weighting of the principle components 1-n before the addition (for example, the superposition of the principle components). However, it is also possible to steplessly cross-fade between discrete filters.

For example, the following methods could be used (wherein the complexity increases):
- Weighting of a single filter between 0 percent and 100 percent, which can be adjusted using a slider, control dial, or the like;
- Cross-fade between two filters (which may be found, for example, by dividing a pool (for example, of sets of reference equalization filter target coefficients) into clusters and averaging); or
- Other methods.

Generally speaking, in some embodiments, the user device performs a linear combination of two or more filter curves, wherein the combination is determined by a slider, or another (for example, single) user interface item.

Regarding the principle component analysis, reference is also made to document [7].

To further conclude, embodiments according to the invention create a concept for improving the perceived audio quality of headphones. The better sound quality is based on filters that are specially designed for headphones. These filters are compensating deficiencies which are unique for each headphone. Embodiments according to the invention allow for a stepless transition between different filters, and thereby enable a user to easily find the desired filter parameters without prior knowledge of the headphone type.

An embodiment according the invention creates a one-slider-solution, which may be used for adjusting an equalizer.

Some embodiments according to the invention bring along one or more of the following specific improvements:
- The most important advantage for the user is an improved sound quality, due to better frequency response of the headphone (as deficiencies of the headphones are compensated);
- The user does not have to spend much money on expensive headphones in order to achieve good audio quality;
- Devices using the invention are easy to use; the user does not have to go into details (like setting parameters of an equalizer) or measure frequency responses of a headphone. By simple means like a knob or a slider, the user can tune the filter-curves until the result is satisfactory;
- The audio quality of cheap (and not ideal) headphones can be improved; and
- Multimedia software vendors can develop applications that include headphone equalization for the audio signals.

Embodiments according to the invention can be used, for example, in the following technical application areas:
- Smart-phones;
- Personal music players;
- Tablet devices;
- Blu-ray/DVD/CD-players;
- A/V receivers;
- TV sets;
- In-car/in-flight entertainment systems;
- Professional audio;
- Soundcards;
- Headphone amplifiers.

9. Implementation Alternatives

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

REFERENCES

[1] Møller, H.; Jensen, C.; Hammershøi, D. & Sørensen, M. Design Criteria for Headphones J. Audio Eng. Soc, 1995, 43, 218-232
[2] Lorho, Gaëtan: Subjective Evaluation of Headphone Target Frequency Respon-es. In: Audio Engineering Society Convention 126 #7770. Munich, Germany, May 2009
[3] Bestimmung der Schallimmission von ohrnahen Schallquellen Teil 1: Verfahren mit Mikrofonen in menschlichen Ohren (MIRE-Verfahren), DIN EN ISO 11904-1, Deutsches Institut für Normung e. V., February 2003
[4] Akustik—Simulatoren des menschlichen Kopfes und Ohres—Teil 1: Ohrsimulator zur Kalibrierung von supraauralen und circumauralen Kopfhörern (IEC 60318-1: 2009); Deutsche Fassung EN 60318-1:2009, Deutsches Institut für Normung e. V., July 2010
[5] Fleischmann, Silzle, Plogsties: Headphone Equalization—Measurement, Design and Psychoacoustic Evaluation, Microelectronic Systems, Springer Verlag 2011, Pages 301-312
[6] Jolliffe I. T. *Principal Component Analysis*, Series: *Springer Series in Statistics,* 2nd ed., Springer, N Y, 2002, XXIX, 487 p. 28 illus. ISBN 978-0-387-95442-4
[7] SUNGMOK HWANG AND YOUNGJIN PARK, "HRIR CUSTOMIZATION IN THE MEDIAN PLANE VIA PRINCIPAL COMPONENTS ANALYSIS", AES 31st International Conference, London, U K, 2007 Jun. 25-27
[8] WO2010/138309

The invention claimed is:
1. An apparatus, comprising:
an equalization filter coefficient determinator for determining a current set of equalization filter coefficients for use by an equalizer,
wherein the equalization filter coefficient determinator is configured to continuously or quasi-continuously fade between a plurality of different equalizer settings in dependence on one or more setting parameters, to acquire the current set of equalization filter coefficients,
wherein a current equalizer setting is described by the current set of equalization filter target coefficients, and
wherein a number of setting parameters is smaller than a number of equalization filter target coefficients of the current set of equalization filter target coefficients;
wherein the equalization filter coefficient determinator is configured to acquire the one or more setting parameters from a user interface,
wherein the equalization filter coefficient determinator is configured to allow a user to continuously or quasi-continuously fade between a plurality of different equalizer settings in dependence on the one or more setting parameters, such that the user can directly adjust the equalizer setting by varying the one or more setting parameters;
wherein the equalization filter coefficient determinator is configured to variably combine
  (i) N' principle components of N sets of reference equalization filter target coefficients in dependence on the one or more setting parameters, in order to acquire the current set of equalization filter target coefficients,
  wherein N'≥2,
  and wherein
  N>N'; or
  (ii) a first set of equalization filter target coefficients, which is a mean of a plurality of N sets of reference equalization filter target coefficients, and a second set of equalization filter target coefficients, which is a first principal component of the plurality of N sets of reference equalization filter target coefficients, in dependence on one setting parameter, in order to acquire the current set of equalization filter target coefficients;
an equalizer configured to receive the current set of equalization filter target coefficients from the equalization filter coefficient determinator and to equalize an audio signal to be output by a sound transducer based on the received set of equalization filter target coefficients; and
wherein at least one of the following conditions is satisfied:
  the equalization filter target coefficients represent amplitudes of a target equalization filter response for a plurality of different frequencies,
  the equalizer is configured to apply the equalization filter target coefficients as gain factors or as weighting coefficients to frequency domain coefficients representing the audio signal, and
  each of the equalization filter target coefficients determines a gain or a weighting of one or more frequency domain components representing the audio signal.

2. The apparatus according to claim 1, wherein the equalization filter coefficient determinator is configured to continuously or quasi-continuously fade between a plurality of different equalizer settings in dependence on a single setting parameter.

3. The apparatus according to claim 2,
wherein the equalization filter target coefficients are associated with different frequencies or frequency ranges, and
wherein the equalization filter coefficient determinator is configured such that a change of the single setting parameter varies equalization filter target coefficients of the set of equalization filter coefficients associated with at least one half of an entire frequency range covered by the set of equalization filter target coefficients.

4. The apparatus according to claim 1, wherein the equalization filter coefficient determinator is configured to acquire the one or more setting parameters from one or more sliders, or to acquire the one or more setting parameters from one or more knobs.

5. The apparatus according to claim 1, wherein the equalization filter coefficient determinator is configured to acquire two or three setting parameters on the basis of a two-dimensional position information or a three-dimensional position information, which two-dimensional position information or three-dimensional position information is acquired using a two-dimensional or three-dimensional user input device.

6. The apparatus according to claim 1, wherein the equalization filter coefficient determinator is configured to add a weighted version of a second set of equalization filter target coefficients, weighted in dependence on one of the one or more setting parameters, to a first set of equalization filter target coefficients, to acquire the current set of equalization filter target coefficients.

7. The apparatus according to claim 6, wherein the first set of equalization filter target coefficients and the second set of equalization filter target coefficients are principle components of more than two sets of reference equalization filter target coefficients.

8. The apparatus according to claim 1,
wherein the equalization filter coefficient determinator is configured to continuously or quasi-continuously fade between a plurality of different sets of equalization filter target coefficients in dependence on one or more setting parameters, to acquire the current set of equalization filter target coefficients,
wherein a first one of the different sets of equalization filter target coefficients is based on a first cluster of sets of reference equalization filter target coefficients, and
wherein a second one of the different sets of equalization filter target coefficients is based on a second cluster of sets of reference equalization filter target coefficients.

9. The apparatus according to claim 1,
wherein the equalization filter coefficient determinator is configured to continuously or quasi-continuously fade between a plurality of different sets of equalization filter target coefficients, which are representative sets of equalization filter target coefficients associated with different models of one type of sound transducers, in dependence on one or more setting parameters, to acquire the current set of equalization filter target coefficients.

10. The apparatus according to claim 1,
wherein the equalization filter coefficient determinator is configured to adjustably combine a plurality of different sets of equalization filter target coefficients, which describe equalization filters associated with a compensation of different characteristic features of sound transducers, in dependence on one or more setting parameters, to acquire the current set of equalization filter target coefficients; or
wherein the equalization filter coefficient determinator is configured to adjustably combine one or more sets of equalization filter target coefficients, which describe equalization filters associated with a compensation of different characteristic features of sound transducers, with a basic set of equalization filter target coefficients in dependence on one or more setting parameters, to acquire the current set of equalization filter target coefficients.

11. The apparatus according to claim 1, wherein the equalization filter target coefficients are equalization filter coefficients of an equalization filter, or wherein the equalization filter target coefficients represent amplitudes of a target frequency response of an equalization filter for plurality of associated frequencies or frequency ranges.

12. An apparatus, comprising:
a user interface, wherein the user interface is configured to acquire one or more setting parameters in response to a user interaction; and
the apparatus according to claim 1, wherein the equalization filter coefficient determinator is configured to receive the setting parameters from the user interface.

13. A system, comprising:
an equalization filter coefficient processor;
wherein the equalization filter coefficient processor is configured to acquire N sets of reference equalization filter target coefficients; and
wherein the equalization filter coefficient processor is configured to determine N' sets of basis equalization filter target coefficients representing a plurality of characteristic features of the N sets of reference equalization filter target coefficients; and
wherein the equalization filter coefficient processor is configured to provide the N' sets of basis equalization filter target coefficients to an equalization filter coefficient determinator for the derivation of a current set of equalization filter target coefficients;
wherein N'≥2,
wherein N>N',
and
the apparatus according to claim 1.

14. An apparatus, comprising:
an equalization filter coefficient determinator for determining a current set of equalization filter target coefficients for use by an equalizer,
wherein the equalization filter coefficient determinator is configured to linearly combine a plurality of equalization filter target coefficient set components in dependence on one or more setting parameters, to acquire the current set of equalization filter target coefficients,
wherein a current equalizer setting is described by the current set of equalization filter target coefficients,
wherein a number of setting parameters is smaller than a number of equalization filter target coefficients of the current set of equalization filter target coefficients,
an equalizer configured to receive the current set of equalization filter target coefficients from the equalization filter coefficient determinator and to equalize an audio signal to be output by a sound transducer based on the received set of equalization filter target coefficients; and
wherein at least one of the following conditions is satisfied:
the equalization filter target coefficients represent amplitudes of a target equalization filter response for a plurality of different frequencies,
the equalizer is configured to apply the equalization filter target coefficients as gain factors or as weighting coefficients to frequency domain coefficients representing the audio signal, and
each of the equalization filter target coefficients determines a gain or a weighting of one or more frequency domain components representing the audio signal.

15. The apparatus according to claim 14,
wherein the equalization filter coefficient determinator is configured to linearly combine the plurality of equalization filter target coefficient set components in dependence on a single setting parameter.

16. The apparatus according to claim 14, wherein the equalization filter coefficient determinator is configured to add a weighted version of a second set of equalization filter target coefficients, weighted in dependence on one of the one or more variable setting parameters, to a first set of equalization filter target coefficients, to acquire the current set of equalization filter target coefficients.

17. An apparatus, comprising:
a user interface, wherein the user interface is configured to acquire one or more setting parameters in response to a user interaction; and the apparatus according to claim 14, wherein the equalization filter coefficient determinator is configured to receive the setting parameters from the user interface.

18. A system, comprising:

an equalization filter coefficient processor, wherein the equalization filter coefficient processor is configured to acquire N sets of reference equalization filter target coefficients; and wherein the equalization filter coefficient processor is configured to determine N' sets of basis equalization filter target coefficients representing a plurality of characteristic features of the N sets of reference equalization filter target coefficients; and wherein the equalization filter coefficient processor is configured to provide the N' sets of basis equalization filter target coefficients to an equalization filter coefficient determinator for the derivation of a current set of equalization filter target coefficients;

wherein $N' \geq 2$, wherein $N > N'$, and the apparatus according to claim 14.

19. An apparatus, comprising:

an equalization filter coefficient determinator for determining a current set of equalization filter target coefficients for use by an equalizer, wherein the equalization filter coefficient determinator is configured to acquire the current set of equalization filter target coefficients in dependence on a two-dimensional position information or a three-dimensional position information acquired using a two-dimensional or three-dimensional user input device;

wherein the equalization filter coefficient determinator is configured to continuously or quasi-continuously fade between a plurality of different equalizer settings in dependence on two or three setting parameters derived from the position information, to acquire the current set of equalization filter target coefficients, or wherein the equalization filter coefficient determinator is configured to linearly combine a plurality of equalization filter set components in dependence on two or three setting parameters derived from the position information, to acquire the current set of equalization filter target coefficients;

an equalizer configured to receive the current set of equalization filter target coefficients from the equalization filter coefficient determinator and to equalize an audio signal to be output by a sound transducer based on the received set of equalization filter target coefficients; and wherein at least one of the following conditions is satisfied:

the equalization filter target coefficients represent amplitudes of a target equalization filter response for a plurality of different frequencies, the equalizer is configured to apply the equalization filter target coefficients as gain factors or as weighting coefficients to frequency domain coefficients representing the audio signal, and each of the equalization filter target coefficients determines a gain or a weighting of one or more frequency domain components representing the audio signal.

20. An apparatus, comprising:

a user interface, wherein the user interface is configured to acquire one or more setting parameters in response to a user interaction; and the apparatus according to claim 19, wherein the equalization filter coefficient determinator is configured to receive the setting parameters from the user interface.

21. A system, comprising:

an equalization filter coefficient processor, wherein the equalization filter coefficient processor is configured to acquire N sets of reference equalization filter target coefficients; and wherein the equalization filter coefficient processor is configured to determine N' sets of basis equalization filter target coefficients representing a plurality of characteristic features of the N sets of reference equalization filter target coefficients; and wherein the equalization filter coefficient processor is configured to provide the N' sets of basis equalization filter target coefficients to an equalization filter coefficient determinator for the derivation of a current set of equalization filter target coefficients;

wherein $N' \geq 2$, wherein $N > N'$, and the apparatus according to claim 19.

22. A method for equalizing an audio signal, the method comprising:

determining a current set of equalization filter target coefficients for use in an equalization, wherein determining the current set of equalization filter target coefficients comprises continuously or quasi-continuously fading between a plurality of different equalizer settings in dependence on one or more setting parameters, to acquire the current set of equalization filter target coefficients, wherein a current equalizer setting is described by the current set of equalization parameters, and wherein a number of setting parameters is smaller than a number of equalization filter target coefficients of the current set of equalization filter target coefficients;

wherein the one or more setting parameters are acquired from a user interface, to allow a user to continuously or quasi-continuously fade between a plurality of different equalizer settings in dependence on the one or more setting parameters, and such that the user can directly adjust the equalizer setting by varying the one or more setting parameters;

wherein determining the current set of equalization filter target coefficients comprises variably combining (i) N' principle components of N sets of reference equalization filter target coefficients in dependence on the one or more setting parameters, in order to acquire the current set of equalization filter target coefficients, wherein $N' \geq 2$, and wherein $N > N'$; or (ii) a first set of equalization filter target coefficients, which is a mean of a plurality of N sets of reference equalization filter target coefficients, and a second set of equalization filter target coefficients, which is a first principal component of the plurality of N sets of reference equalization filter target coefficients, in dependence on one setting parameter, in order to acquire the current set of equalization filter target coefficients;

equalizing the audio signal to be output by a sound transducer based on the current set of equalization filter target coefficients; and wherein at least one of the following conditions is satisfied:
  the equalization filter target coefficients represent amplitudes of a target equalization filter response for a plurality of different frequencies,
  the equalization filter target coefficients are applied as gain factors or as weighting coefficients to frequency domain coefficients representing the audio signal, and
  each of the equalization filter target coefficients determines a gain or a weighting of one or more frequency domain components representing the audio signal.

23. A non-transitory computer readable medium including a computer program for performing the method according to claim 22 when the computer program runs on a computer.

24. A method for equalizing an audio signal, the method comprising:
  determining a current set of equalization filter target coefficients for use in an equalization,
  wherein determining the current set of equalization filter target coefficients comprises linearly combining a plurality of equalization filter target coefficient set components in dependence on one or more setting parameters, to acquire the current set of equalization filter target coefficients,
  wherein a current equalizer setting is described by the current set of equalization filter target coefficients, and
  wherein a number of setting parameters is smaller than a number of equalization filter target coefficients of the current set of equalization filter target coefficients;
  equalizing the audio signal to be output by a sound transducer based on the current set of equalization filter target coefficients; and
  wherein at least one of the following conditions is satisfied:
    the equalization filter target coefficients represent amplitudes of a target equalization filter response for a plurality of different frequencies,
    the equalization filter target coefficients are applied as gain factors or as weighting coefficients to frequency domain coefficients representing the audio signal, and
    each of the equalization filter target coefficients determines a gain or a weighting of one or more frequency domain components representing the audio signal.

25. A non-transitory computer readable medium including a computer program for performing the method according to claim 24 when the computer program runs on a computer.

26. A method for equalizing an audio signal, the method comprising:
  determining a current set of equalization filter target coefficients for use by an equalizer,
  wherein determining the current set of equalization filter target coefficients comprises continuously or quasi-continuously fading between a plurality of different equalizer settings in dependence on one or more setting parameters, to acquire the current set of equalization filter target coefficients,
  wherein a current equalizer setting is described by the current set of equalization parameters, and
  wherein a number of setting parameters is smaller than a number of equalization filter target coefficients of the current set of equalization filter target coefficients;
  wherein the one or more setting parameters are acquired from a user interface, to allow a user to continuously or quasi-continuously fade between a plurality of different equalizer settings in dependence on the one or more setting parameters, and such that the user can directly adjust the equalizer setting by varying the one or more setting parameters;
  wherein determining the current set of equalization filter target coefficients comprises continuously or quasi-continuously fading between a plurality of different sets of equalization filter target coefficients, which are representative sets of equalization filter target coefficients associated with different models of one type of sound transducers, in dependence on one or more setting parameters, to acquire the current set of equalization filter target coefficients;
  equalizing the audio signal to be output by a sound transducer based on the current set of equalization filter target coefficients; and
  wherein at least one of the following conditions is satisfied:
    the equalization filter target coefficients represent amplitudes of a target equalization filter response for a plurality of different frequencies,
    the equalization filter target coefficients are applied as gain factors or as weighting coefficients to frequency domain coefficients representing the audio signal, and
    each of the equalization filter target coefficients determines a gain or a weighting of one or more frequency domain components representing the audio signal.

27. A non-transitory computer readable medium including a computer program for performing the method according to claim 26 when the computer program runs on a computer.

28. An apparatus, comprising:
  an equalization filter coefficient determinator for determining a current set of equalization filter coefficients for use by an equalizer,
  wherein the equalization filter coefficient determinator is configured to continuously or quasi-continuously fade between a plurality of different equalizer settings in dependence on one or more setting parameters, to acquire the current set of equalization filter coefficients,
  wherein a current equalizer setting is described by the current set of equalization filter target coefficients, and
  wherein a number of setting parameters is smaller than a number of equalization filter target coefficients of the current set of equalization filter target coefficients;
  wherein the equalization filter coefficient determinator is configured to acquire the one or more setting parameters from a user interface,
  wherein the equalization filter coefficient determinator is configured to allow a user to continuously or quasi-continuously fade between a plurality of different equalizer settings in dependence on the one or more setting parameters, such that the user can directly adjust the equalizer setting by varying the one or more setting parameters;
  wherein the equalization filter coefficient determinator is configured to continuously or quasi-continuously fade between a plurality of different sets of equalization filter target coefficients, which are representative sets of equalization filter target coefficients associated with different models of one type of sound transducers, in dependence on one or more setting parameters, to acquire the current set of equalization filter target coefficients;
  an equalizer configured to receive the current set of equalization filter target coefficients from the equalization filter coefficient determinator and to equalize an audio signal to be output by a sound transducer based on the received set of equalization filter target coefficients; and wherein at least one of the following conditions is satisfied:
- the equalization filter target coefficients represent amplitudes of a target equalization filter response for a plurality of different frequencies,
- the equalizer is configured to apply the equalization filter target coefficients as gain factors or as weighting coefficients to frequency domain coefficients representing the audio signal, and
- each of the equalization filter target coefficients determines a gain or a weighting of one or more frequency domain components representing the audio signal.

29. A method for equalizing an audio signal, the method comprising:

determining a current set of equalization filter target coefficients for use in an equalization, wherein determining the current set of equalization filter target coefficients comprises linearly combining a plurality of equalization filter target coefficient set components in dependence on two or more setting parameters, to acquire the current set of equalization filter target coefficients, wherein a current equalizer setting is described by the current set of equalization filter target coefficients, and wherein a number of setting parameters is smaller than a number of equalization filter target coefficients of the current set of equalization filter target coefficients;

equalizing the audio signal to be output by a sound transducer based on the current set of equalization filter target coefficients; and wherein at least one of the following conditions is satisfied:
- the equalization filter target coefficients represent amplitudes of a target equalization filter response for a plurality of different frequencies,
- the equalization filter target coefficients are applied as gain factors or as weighting coefficients to frequency domain coefficients representing the audio signal, and
- each of the equalization filter target coefficients determines a gain or a weighting of one or more frequency domain components representing the audio signal.

30. An apparatus, comprising:

an equalization filter coefficient determinator for determining a current set of equalization filter target coefficients for use by an equalizer, wherein the equalization filter coefficient determinator is configured to linearly combine a plurality of equalization filter target coefficient set components in dependence on two or more setting parameters, to acquire the current set of equalization filter target coefficients, wherein a current equalizer setting is described by the current set of equalization filter target coefficients, wherein a number of setting parameters is smaller than a number of equalization filter target coefficients of the current set of equalization filter target coefficients, an equalizer configured to receive the current set of equalization filter target coefficients from the equalization filter coefficient determinator and to equalize an audio signal to be output by a sound transducer based on the received set of equalization filter target coefficients; and wherein at least one of the following conditions is satisfied:
- the equalization filter target coefficients represent amplitudes of a target equalization filter response for a plurality of different frequencies,
- the equalizer is configured to apply the equalization filter target coefficients as gain factors or as weighting coefficients to frequency domain coefficients representing the audio signal, and
- each of the equalization filter target coefficients determines a gain or a weighting of one or more frequency domain components representing the audio signal.

31. A method for equalizing an audio signal, the method comprising:

determining a current set of equalization filter target coefficients for use by an equalizer, wherein determining the current set of equalization filter target coefficients comprises continuously or quasi-continuously fading between a plurality of different equalizer settings in dependence on two or more setting parameters, to acquire the current set of equalization filter target coefficients, wherein a current equalizer setting is described by the current set of equalization parameters, and wherein a number of setting parameters is smaller than a number of equalization filter target coefficients of the current set of equalization filter target coefficients;

wherein the two or more setting parameters are acquired from a user interface, to allow a user to continuously or quasi-continuously fade between a plurality of different equalizer settings in dependence on the two or more setting parameters, and such that the user can directly adjust the equalizer setting by varying the two or more setting parameters;

wherein determining the current set of equalization filter target coefficients comprises continuously or quasi-continuously fading between a plurality of different sets of equalization filter target coefficients, which are representative sets of equalization filter target coefficients associated with different models of one type of sound transducers, in dependence on two or more setting parameters, to acquire the current set of equalization filter target coefficients;

equalizing the audio signal to be output by a sound transducer based on the current set of equalization filter target coefficients; and wherein at least one of the following conditions is satisfied:
- the equalization filter target coefficients represent amplitudes of a target equalization filter response for a plurality of different frequencies,
- the equalization filter target coefficients are applied as gain factors or as weighting coefficients to frequency domain coefficients representing the audio signal, and
- each of the equalization filter target coefficients determines a gain or a weighting of one or more frequency domain components representing the audio signal.

* * * * *